(12) United States Patent
Yamazaki et al.

(10) Patent No.: US 9,349,791 B2
(45) Date of Patent: *May 24, 2016

(54) SEMICONDUCTOR DEVICE HAVING OXIDE SEMICONDUCTOR CHANNEL

(71) Applicant: Semiconductor Energy Laboratory Co., Ltd., Atsugi-shi, Kanagawa-ken (JP)

(72) Inventors: Shunpei Yamazaki, Setagaya (JP); Kei Takahashi, Isehara (JP); Yoshiaki Ito, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/677,180

(22) Filed: Apr. 2, 2015

(65) Prior Publication Data

US 2015/0279929 A1  Oct. 1, 2015

Related U.S. Application Data

(60) Continuation of application No. 14/182,726, filed on Feb. 18, 2014, now Pat. No. 8,999,751, which is a division of application No. 12/894,911, filed on Sep. 30, 2010, now Pat. No. 9,006,728.

(30) Foreign Application Priority Data

Oct. 9, 2009 (JP) ................. 2009-235604

(51) Int. Cl.
*H01L 29/12* (2006.01)
*H01L 29/04* (2006.01)
(Continued)

(52) U.S. Cl.
CPC .......... *H01L 29/0611* (2013.01); *H01L 29/045* (2013.01); *H01L 29/24* (2013.01);
(Continued)

(58) Field of Classification Search
CPC .................. H01L 29/0611; H01L 29/78696; H01L 29/24; H01L 29/045; H01L 29/78693; H01L 29/7869; H01L 27/1225
USPC .................. 257/43, 64, 66, 72, E29.068
See application file for complete search history.

(56) References Cited

U.S. PATENT DOCUMENTS 5,622,653 A   4/1997  Orita et al.
5,681,671 A   10/1997 Orita et al.
(Continued)

FOREIGN PATENT DOCUMENTS

CN   001934712 A   3/2007
EP   0686982 A    12/1995
(Continued)

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
(Continued)

*Primary Examiner* — Shouxiang Hu
(74) *Attorney, Agent, or Firm* — Robinson Intellectual Property Law Office; Eric J. Robinson

(57) ABSTRACT

It is an object to provide a semiconductor device having a new productive semiconductor material and a new structure. The semiconductor device includes a first conductive layer over a substrate, a first insulating layer which covers the first conductive layer, an oxide semiconductor layer over the first insulating layer that overlaps with part of the first conductive layer and has a crystal region in a surface part, second and third conductive layers formed in contact with the oxide semiconductor layer, an insulating layer which covers the oxide semiconductor layer and the second and third conductive layers, and a fourth conductive layer over the insulating layer that overlaps with part of the oxide semiconductor layer.

26 Claims, 19 Drawing Sheets

650

(51) Int. Cl.
  *H01L 31/036*  (2006.01)
  *H01L 29/06*  (2006.01)
  *H01L 29/417*  (2006.01)
  *H01L 29/423*  (2006.01)
  *H01L 29/786*  (2006.01)
  *H01L 29/66*  (2006.01)
  *H01L 29/24*  (2006.01)

(52) U.S. Cl.
  CPC .... *H01L29/41733* (2013.01); *H01L 29/42384* (2013.01); *H01L 29/66477* (2013.01); *H01L 29/7869* (2013.01); *H01L 29/78642* (2013.01); *H01L 29/78648* (2013.01); *H01L 29/78693* (2013.01); *H01L 29/78696* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,843,341 A | 12/1998 | Orita et al. |
| 5,955,178 A | 9/1999 | Orita et al. |
| 6,001,539 A | 12/1999 | Lyu et al. |
| 6,100,954 A | 8/2000 | Kim et al. |
| 6,188,452 B1 | 2/2001 | Kim et al. |
| 6,211,928 B1 | 4/2001 | Oh et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,885,146 B2 | 4/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,145,174 B2 | 12/2006 | Chiang et al. |
| 7,145,176 B2 | 12/2006 | Kawasaki et al. |
| 7,211,825 B2 | 5/2007 | Shih et al |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,608,531 B2 | 10/2009 | Isa et al. |
| 7,655,566 B2 | 2/2010 | Fujii |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,767,595 B2 | 8/2010 | Tanaka et al. |
| 7,791,074 B2 | 9/2010 | Iwasaki |
| 7,884,360 B2 | 2/2011 | Takechi et al. |
| 7,935,964 B2 | 5/2011 | Kim et al. |
| 7,998,372 B2 | 8/2011 | Yano et al. |
| 8,067,775 B2 | 11/2011 | Miyairi et al. |
| 8,168,544 B2 | 5/2012 | Chang |
| 8,202,365 B2 | 6/2012 | Umeda et al. |
| 8,203,144 B2 | 6/2012 | Hoffman et al. |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,247,813 B2 | 8/2012 | Koyama et al. |
| 8,293,661 B2 | 10/2012 | Yamazaki |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,319,218 B2 | 11/2012 | Yamazaki et al. |
| 8,324,621 B2 | 12/2012 | Yamazaki et al. |
| 8,343,799 B2 | 1/2013 | Ito et al. |
| 8,367,489 B2 | 2/2013 | Yamazaki |
| 8,420,442 B2 | 4/2013 | Takechi et al. |
| 8,487,436 B2 | 7/2013 | Isa et al. |
| 8,563,977 B2 | 10/2013 | Shimada et al. |
| 8,647,031 B2 | 2/2014 | Hoffman et al. |
| 8,648,346 B2 | 2/2014 | Isa et al. |
| 9,006,728 B2 * | 4/2015 | Yamazaki ......... H01L 29/41733 257/43 |
| 9,214,563 B2 | 12/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0145143 A1 | 10/2002 | Kawasaki et al. |
| 2003/0173890 A1 | 9/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0016462 A1 | 1/2005 | Yamazaki |
| 2005/0017302 A1 | 1/2005 | Hoffman |
| 2005/0031799 A1 | 2/2005 | Matsumoto et al. |
| 2005/0199879 A1 | 9/2005 | Hoffman et al. |
| 2005/0199959 A1 | 9/2005 | Chiang et al. |
| 2005/0199960 A1 | 9/2005 | Hoffman et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0099747 A1 | 5/2006 | Park |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/1011353 | 6/2006 | Sano et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1 | 12/2007 | Hirao et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057605 A1 | 3/2008 | Morisue et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108229 A1 | 5/2008 | Tanaka et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |

(56) References Cited

U.S. PATENT DOCUMENTS

| | | |
|---|---|---|
| 2008/0248609 A1 | 10/2008 | Yamazaki et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0020753 A1 | 1/2009 | Jeong et al. |
| 2009/0045397 A1 | 2/2009 | Iwasaki |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140337 A1 | 6/2009 | Yamazaki |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0223079 A1 | 9/2009 | Myong |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0044701 A1 | 2/2010 | Sano et al. |
| 2010/0051935 A1 | 3/2010 | Lee et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0102313 A1 | 4/2010 | Miyairi et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123136 A1 | 5/2010 | Lee et al. |
| 2010/0129528 A1 | 5/2010 | Yamazaki et al. |
| 2010/0140599 A1 | 6/2010 | Yano et al. |
| 2010/0140611 A1 | 6/2010 | Itagaki et al. |
| 2010/0155717 A1 | 6/2010 | Yano et al. |
| 2010/0219411 A1 | 9/2010 | Hoffman et al. |
| 2010/0244022 A1 | 9/2010 | Takahashi et al. |
| 2010/0301326 A1 | 12/2010 | Miyairi et al. |
| 2010/0301329 A1 | 12/2010 | Asano et al. |
| 2011/0049509 A1 | 3/2011 | Takahashi et al. |
| 2011/0062433 A1 | 3/2011 | Yamazaki |
| 2011/0062436 A1 | 3/2011 | Yamazaki et al. |
| 2011/0068335 A1 | 3/2011 | Yamazaki et al. |
| 2011/0084264 A1 | 4/2011 | Yamazaki et al. |
| 2011/0084266 A1 | 4/2011 | Yamazaki et al. |
| 2011/0108837 A1 | 5/2011 | Yamazaki et al. |
| 2011/0109351 A1 | 5/2011 | Yamazaki et al. |
| 2011/0117698 A1 | 5/2011 | Suzawa et al. |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133181 A1 | 6/2011 | Yamazaki |
| 2011/0133191 A1 | 6/2011 | Yamazaki |
| 2011/0210355 A1 | 9/2011 | Yamazaki et al. |
| 2012/0161122 A1 | 6/2012 | Yamazaki |
| 2012/0161123 A1 | 6/2012 | Yamazaki |
| 2012/0205651 A1 | 8/2012 | Lee et al. |
| 2012/0208318 A1 | 8/2012 | Hoffman et al. |
| 2012/0256179 A1 | 10/2012 | Yamazaki et al. |
| 2012/0319118 A1 | 12/2012 | Yamazaki |
| 2013/0062601 A1 | 3/2013 | Yamazaki et al. |
| 2013/0193432 A1 | 8/2013 | Yamazaki |
| 2013/0200366 A1 | 8/2013 | Koyama et al. |
| 2013/0200375 A1 | 8/2013 | Yamazaki |
| 2013/0221345 A1 | 8/2013 | Ohno et al. |
| 2013/0237012 A1 | 9/2013 | Takechi et al. |
| 2014/0106506 A1 | 4/2014 | Yamazaki |
| 2014/0138680 A1 | 5/2014 | Isa et al. |
| 2015/0104901 A1 | 4/2015 | Yamazaki et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-163528 A | 6/1992 |
| JP | 05-251705 A | 9/1993 |
| JP | 08-245220 A | 9/1996 |
| JP | 08-264794 A | 10/1996 |
| JP | 09-096836 A | 4/1997 |
| JP | 10-041519 A | 2/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-305306 A | 10/2002 |
| JP | 2003-041362 A | 2/2003 |
| JP | 2003-086000 A | 3/2003 |
| JP | 2003-086808 A | 3/2003 |
| JP | 2003-337353 A | 11/2003 |
| JP | 2004-103957 A | 4/2004 |
| JP | 2004-273614 A | 9/2004 |
| JP | 2004-273732 A | 9/2004 |
| JP | 2006-237587 A | 9/2006 |
| JP | 2007-059893 A | 3/2007 |
| JP | 2007-096055 A | 4/2007 |
| JP | 2007-103918 A | 4/2007 |
| JP | 2007-123861 A | 5/2007 |
| JP | 2007-220820 A | 8/2007 |
| JP | 2007-529117 | 10/2007 |
| JP | 2007-529119 | 10/2007 |
| JP | 2008-042088 A | 2/2008 |
| JP | 2008-060419 A | 3/2008 |
| JP | 2008-135717 A | 6/2008 |
| JP | 2008-243929 A | 10/2008 |
| JP | 2009-099847 A | 5/2009 |
| JP | 2009-167087 A | 7/2009 |
| JP | 2009-176865 A | 8/2009 |
| JP | 2009-528670 | 8/2009 |
| JP | 2009-224479 A | 10/2009 |
| KR | 2006-0132720 A | 12/2006 |
| KR | 2008-0094483 A | 10/2008 |
| TW | 200534369 | 10/2005 |
| TW | I355679 | 1/2012 |
| WO | WO-2004/114391 | 12/2004 |
| WO | WO-2005/093847 | 10/2005 |
| WO | WO-2005/093850 | 10/2005 |
| WO | WO-2007/029844 | 3/2007 |
| WO | WO-2007/058231 | 5/2007 |
| WO | WO-2007/108293 | 9/2007 |
| WO | WO-2007/142167 | 12/2007 |
| WO | WO-2008/117810 | 10/2008 |
| WO | WO-2008/126879 | 10/2008 |
| WO | WO-2008/126884 | 10/2008 |
| WO | WO-2009/093722 | 7/2009 |
| WO | WO-2011/043176 | 4/2011 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m =3, 4, and 5), InGaO3(ZnO)3,

(56) References Cited

OTHER PUBLICATIONS and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Kikuchi.H et al. "Polymer-Stabilized Liquid Crystal Blue Phases", Nature Materials, Sep. 2, 2002, vol. 1, pp. 64-68.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW'09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In QVGA AMOLED Display using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

International Search Report (Application No. PCT/JP2010/065990) Dated Oct. 19, 2010.
Written Opinion (Application No. PCT/JP2010/065990) Dated Oct. 19, 2010.
Pending Claims (U.S. Appl. No. 13/594,934) Dated Mar. 20, 2013.
Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Nakamura.M, "Synthesis of Homologous Compound with New Long-Period Structure", NIRIM Newsletter, Mar. 1, 1995, vol. 150, pp. 1-4.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Korean Office Action (Application No. 2012-7018502) Dated Sep. 4, 2013.
European Search Report (Application No. 10821841.3) Dated Mar. 25, 2014.
Kamiya.T et al., "Self-Adjusted, Three-Dimensional Lattice-Matched Buffer Layer for Growing ZnO Epitaxial Film: Homologous Series Layered Oxide, InGaO3(ZnO)5", Crystal Growth & Design, Sep. 27, 2006, vol. 6, No. 11, pp. 2451-2456.
Taiwanese Office Action (Application No. 099132603) Dated Feb. 12, 2015.
Taiwanese Office Action (Application No. 104127323) Dated Feb. 2, 2016.

* cited by examiner

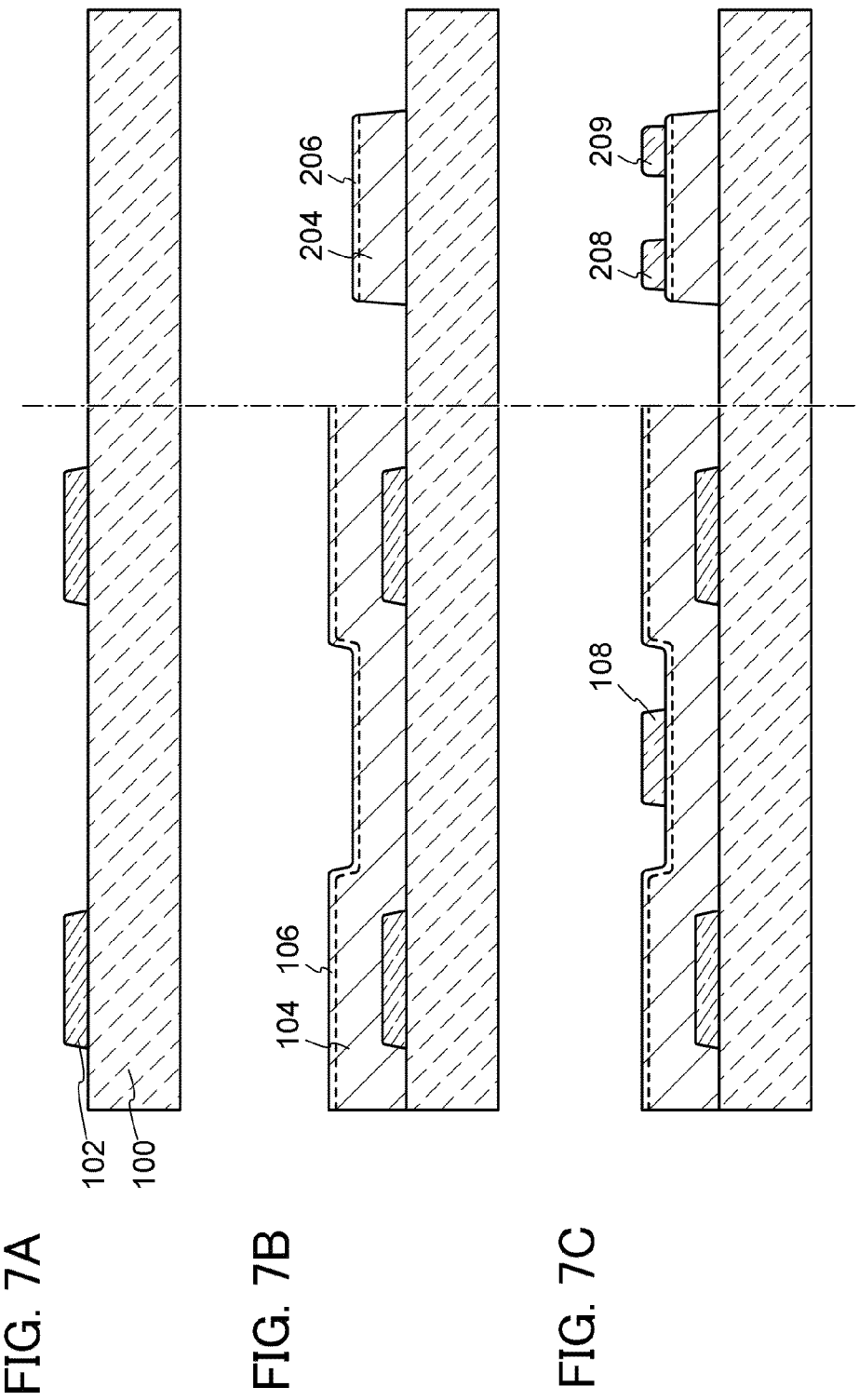

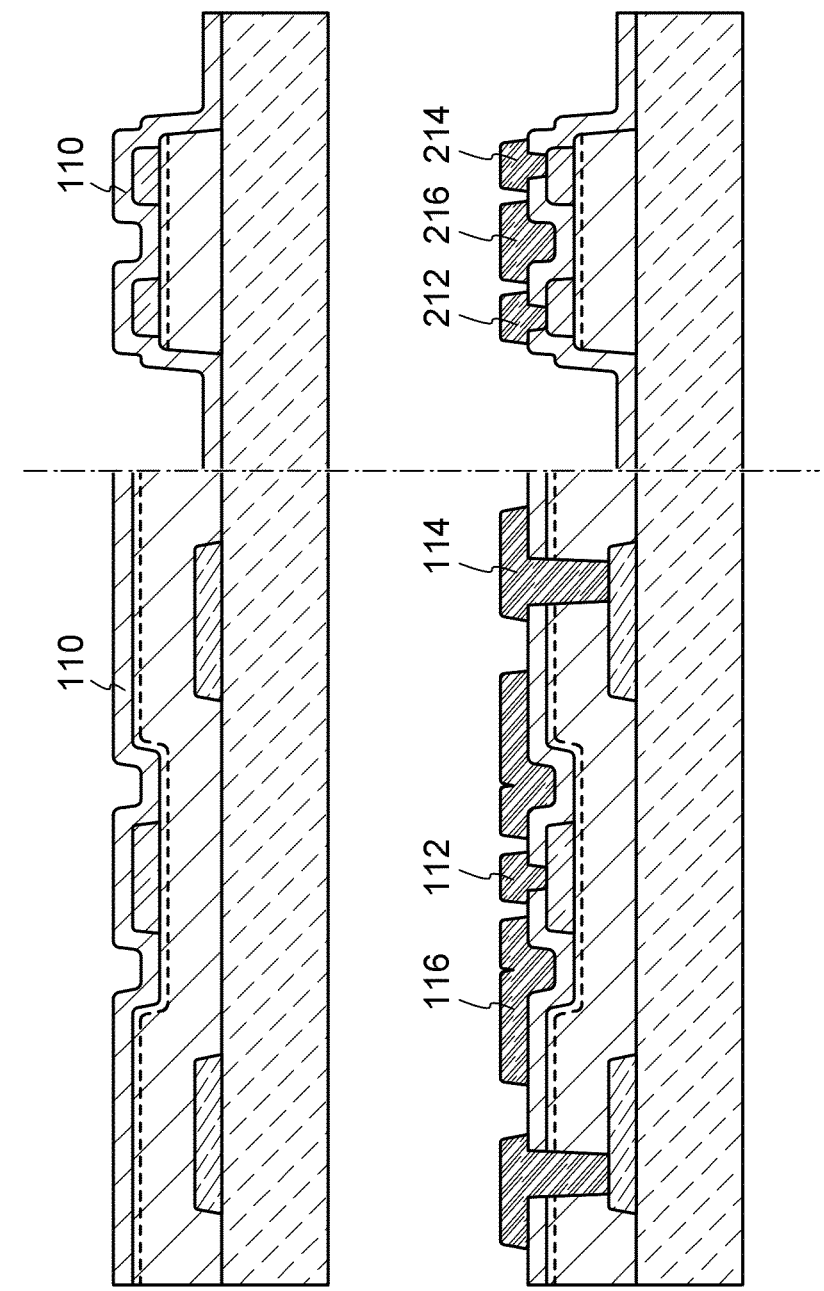

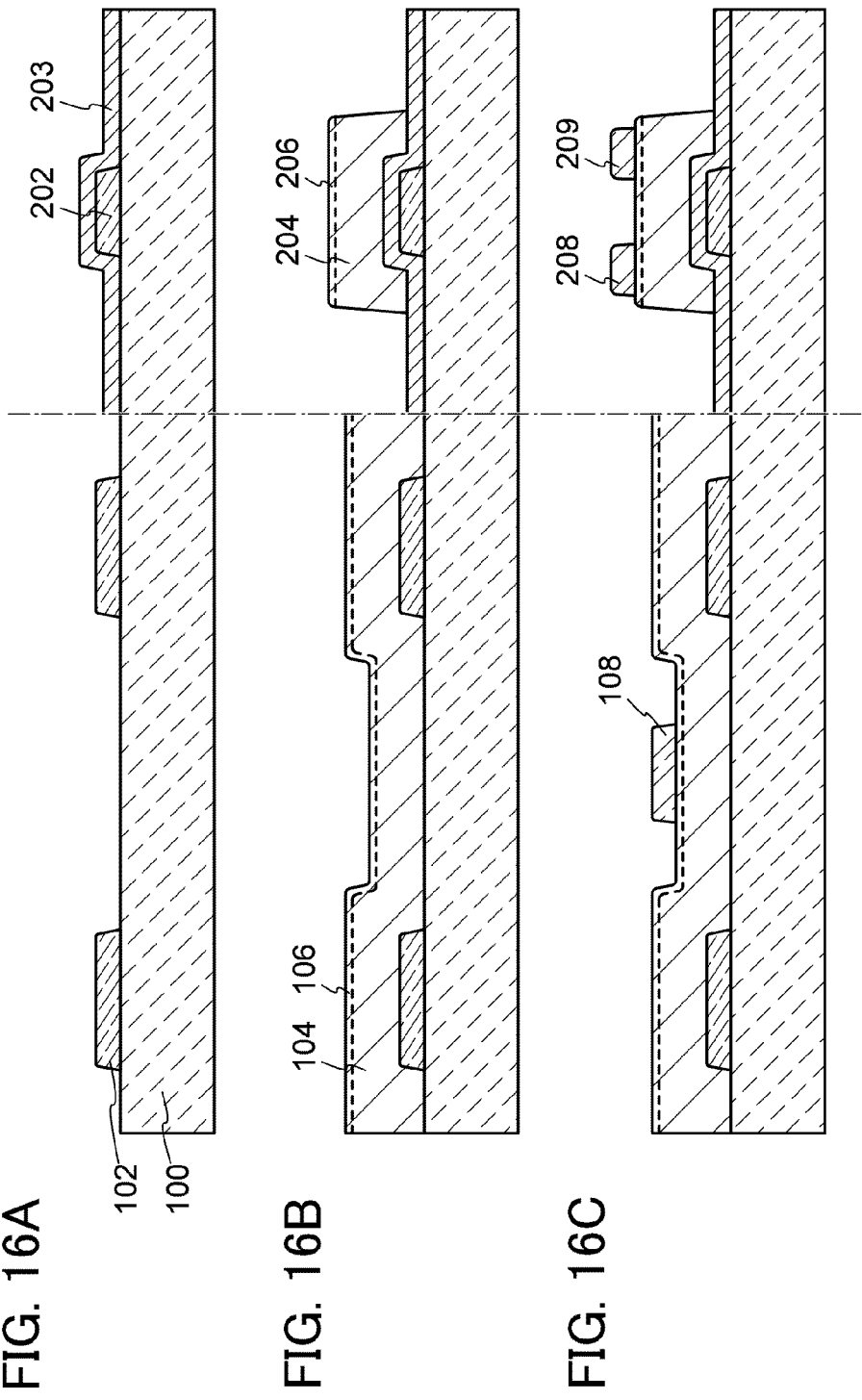

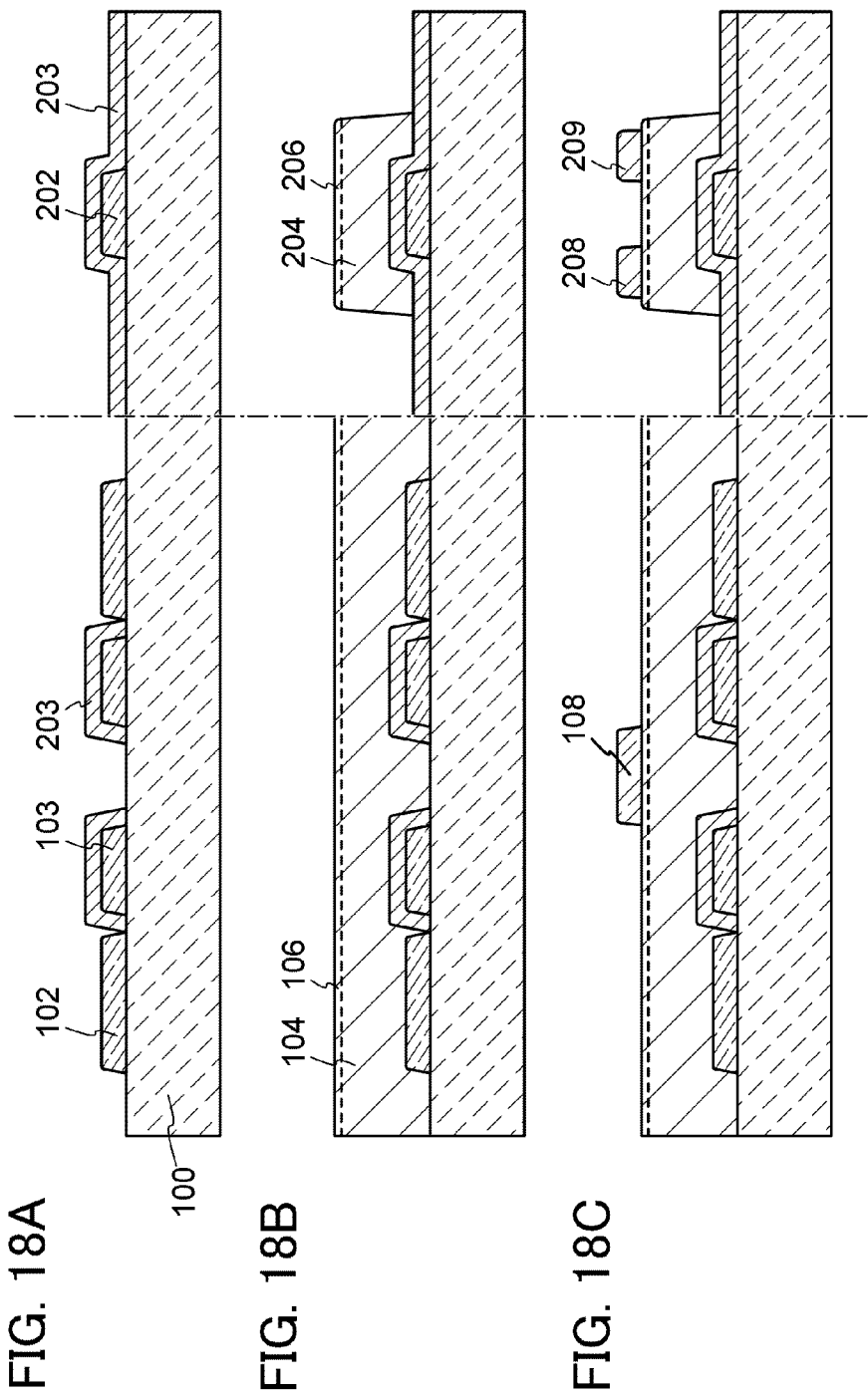

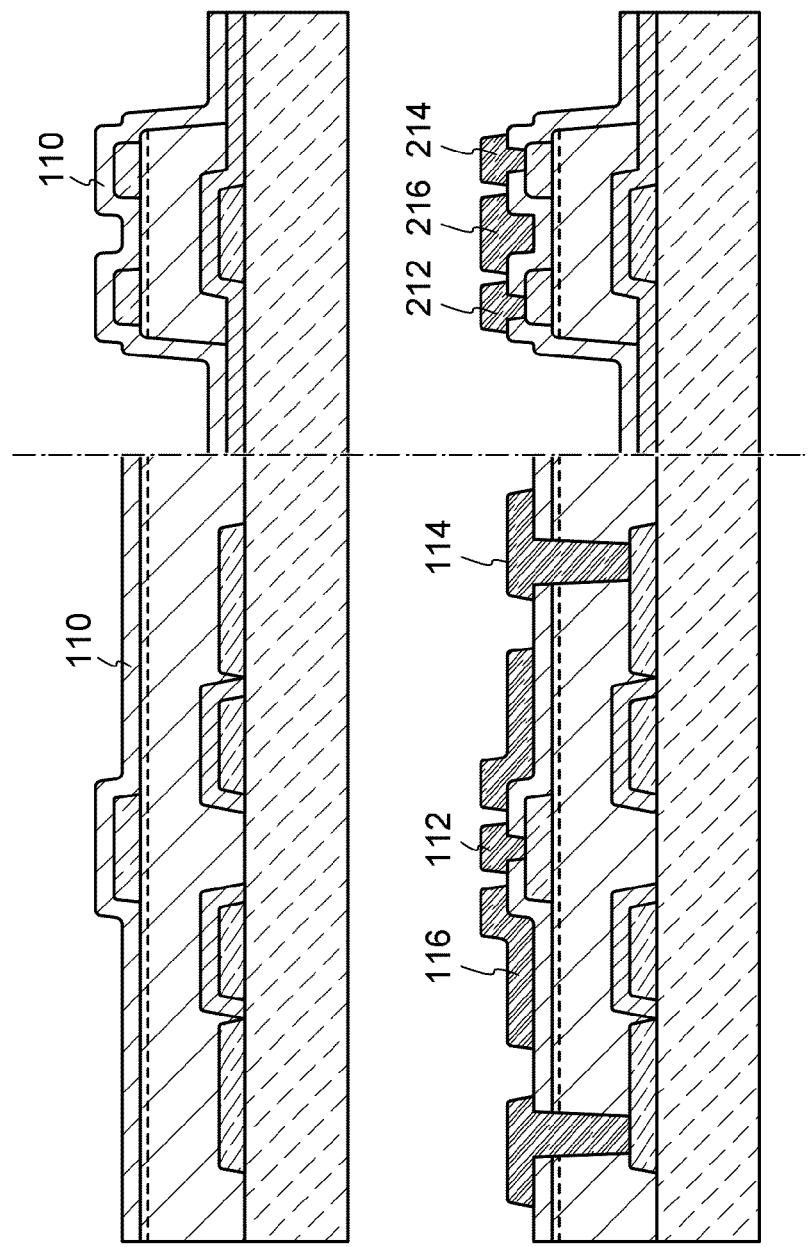

SEMICONDUCTOR DEVICE HAVING OXIDE SEMICONDUCTOR CHANNEL

TECHNICAL FIELD

The technical field of the disclosed invention relates to a semiconductor device and a manufacturing method thereof.

BACKGROUND ART

There are a wide variety of metal oxides and such material oxides are used for a variety of applications. For example, indium oxide is a well-known material and is used as the material of a transparent electrode needed in a liquid crystal display or the like.

Some metal oxides have semiconductor characteristics. Examples of metal oxides having semiconductor characteristics include tungsten oxide, tin oxide, indium oxide, zinc oxide, and the like. Thin film transistors in each of which a channel formation region is formed using such a metal oxide have already been known (for example, see Patent Documents 1 to 4, Non-Patent Document 1, and the like).

Further, not only single-component oxides but also multi-component oxides are known as metal oxides. For example, $InGaO_3(ZnO)_m$ (m: natural number) having a homologous series is known as a multi-component oxide containing In, Ga and Zn (for example, see Non-Patent Documents 2 to 4 and the like).

Furthermore, it is confirmed that an oxide semiconductor including such an In—Ga—Zn-based oxide is applicable to a channel formation region of a thin film transistor (for example, see Patent Document 5, Non-Patent Documents 5 and 6, and the like).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compound", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

DISCLOSURE OF INVENTION

However, in the actual condition, adequate characteristics of semiconductor devices have not been obtained when such oxide semiconductors are used.

In view of the foregoing problem, it is an object of one embodiment of the disclosed invention to provide a semiconductor device having a novel semiconductor material and a novel structure. Alternatively, it is an object of one embodiment of the disclosed invention to provide a high-power semiconductor device having a novel semiconductor material and a novel structure.

One embodiment of the disclosed invention is a semiconductor device with a novel structure. An oxide semiconductor layer having a crystal region in a surface part is used in the semiconductor device. The semiconductor device controls current with two conductive layers.

One embodiment of the disclosed invention is a semiconductor device with a novel structure. Breakdown voltage (e.g., drain breakdown voltage) is improved by an oxide semiconductor layer having a crystal region in a surface part in the semiconductor device.

One embodiment of the disclosed invention is a method for manufacturing the semiconductor device.

For example, one embodiment of the present invention is a semiconductor device including a first conductive layer over a substrate, a first insulating layer which covers the first conductive layer, an oxide semiconductor layer over the first insulating layer that overlaps with part of the first conductive layer and has a crystal region in a surface part, second and third conductive layers formed in contact with the oxide semiconductor layer, an insulating layer which covers the oxide semiconductor layer and the second and third conductive layers, and a fourth conductive layer over the insulating layer that overlaps with part of the oxide semiconductor layer.

In the above semiconductor device, regions except the crystal region in the oxide semiconductor layer are preferably amorphous. Further, the crystal region in the oxide semiconductor layer preferably contains a crystal of $In_2Ga_2ZnO_7$. Furthermore, the oxide semiconductor layer preferably contains an In—Ga—Zn—O-based oxide semiconductor material.

In the above semiconductor device, the second conductive layer, the third conductive layer, and the fourth conductive layer can function as one of a source electrode and a drain electrode, the other of the source electrode and the drain electrode, and a gate electrode, respectively. In addition, the first conductive layer preferably has a function of controlling an electric field in the oxide semiconductor layer. Further, the second conductive layer or the third conductive layer is preferably electrically connected to the oxide semiconductor layer on an upper surface or a lower surface of the oxide semiconductor layer.

One embodiment of the present invention is a method for manufacturing a semiconductor device that includes the following steps: forming a first conductive layer over a substrate; forming a first insulating layer which covers the first conductive layer; forming an oxide semiconductor layer which overlaps with part of the first conductive layer over the first insulating layer; forming a crystal region in an upper surface part of the oxide semiconductor layer by heat treatment of the oxide semiconductor layer; forming second and third conductive layers which are in contact with the oxide semiconductor layer; forming an insulating layer which covers the oxide semiconductor layer and the second and third conductive layers; and forming a fourth conductive layer which overlaps with part of the oxide semiconductor layer over the insulating layer.

In the above method, the crystal region is preferably formed by heat treatment so that the temperature of the oxide semiconductor layer is 500° C. or higher. Further, the oxide semiconductor layer is preferably formed by sputtering with the use of an In—Ga—Zn—O-based target.

Note that in this specification and the like, the term "over" does not necessarily mean that an object is directly on another object. For example, when it is described that "an object is over a substrate", the object is in an upper portion with respect to a surface of the substrate. That is, when the term "over" is used, another object is provided between objects in some cases.

In a semiconductor device according to one embodiment of the disclosed invention, a structure is employed in which a conductive layer is formed below an oxide semiconductor layer in addition to a conductive layer functioning as a so-called gate electrode.

With such a structure, an external electric field can be blocked, so that the adverse effect of the external electric field on the semiconductor device can be reduced. Therefore, generation of parasitic channels due to accumulation of electric charge on the substrate side of the oxide semiconductor layer and fluctuation in the threshold voltage can be prevented.

Further, with the use of an oxide semiconductor layer having a crystal region in a surface part, the operation characteristics of the semiconductor device can be improved.

As described above, according to one embodiment of the disclosed invention, the operation characteristics of a semiconductor device are improved by a crystal region in a surface part of an oxide semiconductor layer, and more stable circuit operation is realized by the action of a conductive layer. Further, since the productivity of the oxide semiconductor layer is high, a semiconductor device with excellent characteristics can be provided at low cost.

Further, according to one embodiment of the disclosed invention, a favorable method for manufacturing the semiconductor device is provided.

BRIEF DESCRIPTION OF DRAWINGS

In the accompanying drawings:

FIGS. 7A to 7C are cross-sectional views illustrating a method for manufacturing a semiconductor device;

FIGS. 8A and 8B are cross-sectional views illustrating a method for manufacturing a semiconductor device;

FIGS. 16A to 16C are cross-sectional views illustrating a method for manufacturing a semiconductor device;

FIGS. 18A to 18C are cross-sectional views illustrating a method for manufacturing a semiconductor device; and FIGS. 19A and 19B are cross-sectional views illustrating a method for manufacturing a semiconductor device.

BEST MODE FOR CARRYING OUT THE INVENTION

Figure 1A:
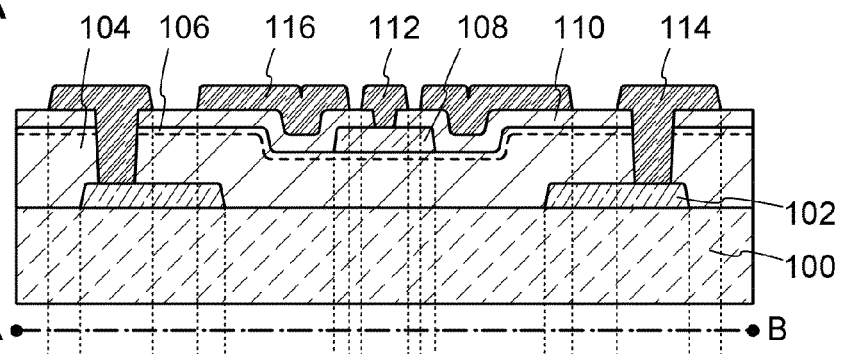
FIGS. 1A and 1B are a cross-sectional view and a plan view illustrating a structure of a semiconductor device.

Hereinafter, embodiments will be described in detail with reference to the drawings. Note that the present invention is not limited to the following description of the embodiments. It will be readily appreciated by those skilled in the art that modes and details can be changed in various ways without departing from the spirit of the invention disclosed in this specification and the like. Structures of different embodiments can be combined with each other as appropriate. Note that in structures of the invention described below, the same portions or portions having similar functions are denoted by the same reference numerals, and description thereof is not repeated.

Embodiment 1

In this embodiment, examples of a semiconductor device and a manufacturing method thereof are described with reference to FIGS. 1A and 1B and FIGS. 2A to 2E. Note that in the following description, a power MOS (MIS) FET is used as a semiconductor device.

<Outline of Semiconductor Device>

Figure 1B:
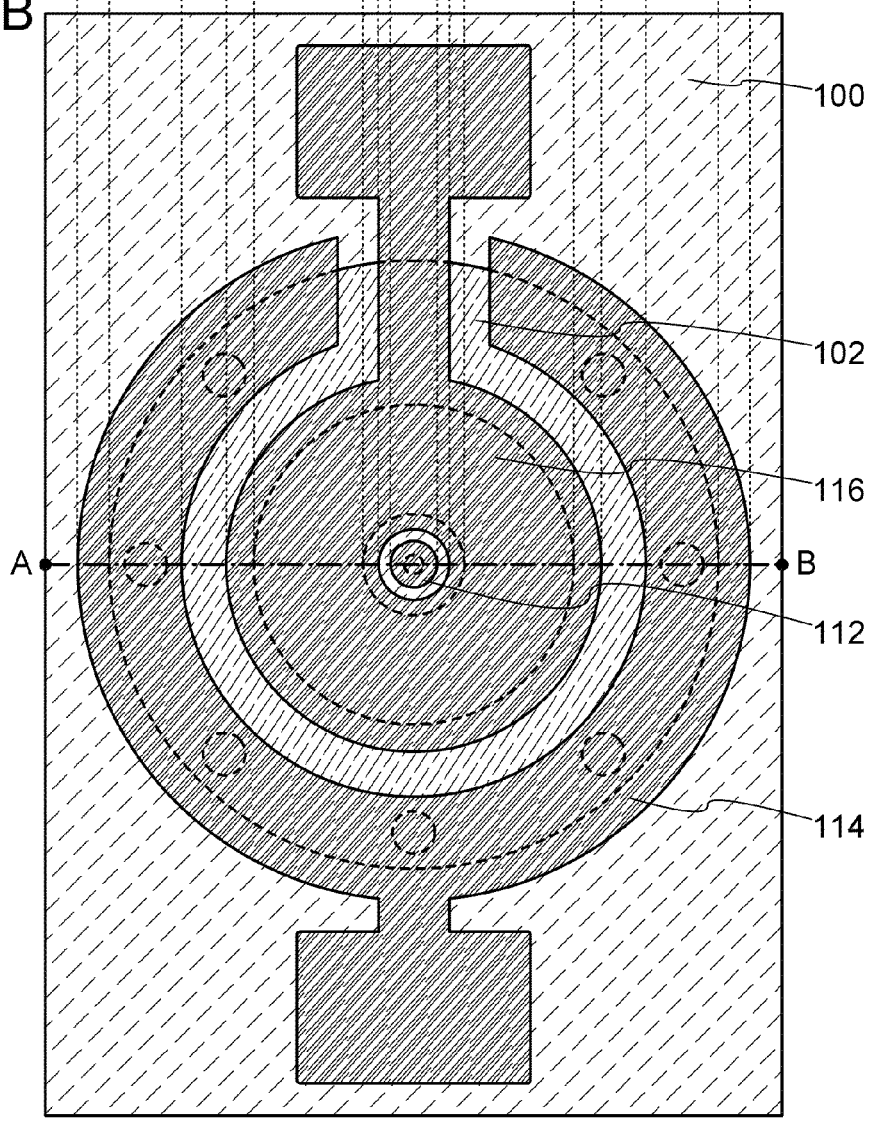

FIGS. 1A and 1B illustrate an example of the structure of a semiconductor device. FIG. 1A corresponds to a cross-sectional view, and FIG. 1B corresponds to a plan view. Further, FIG. 1A corresponds to a cross section taken along line A-B in FIG. 1B. Note that in the plan view, some of components are omitted for simplicity.

The semiconductor device illustrated in FIGS. 1A and 1B includes a substrate 100, a conductive layer 102 functioning as one of a source electrode and a drain electrode, an oxide semiconductor layer 104, a crystal region 106 in the oxide semiconductor layer 104, a conductive layer 108 functioning as the other of the source electrode and the drain electrode, an insulating layer 110 functioning as a gate insulating layer, a conductive layer 112 electrically connected to the conductive layer 108, a conductive layer 114 electrically connected to the conductive layer 102, a conductive layer 116 functioning as a gate electrode, and the like.

Here, the oxide semiconductor layer 104 contains an oxide semiconductor material whose energy gap is comparatively large as a semiconductor. When an oxide semiconductor material whose energy gap is large is used for the semiconductor device, the breakdown voltage (e.g., drain breakdown voltage) of the semiconductor device is improved.

The crystal region 106 corresponds to a surface part (an upper layer) of the oxide semiconductor layer 104 and is a region where part of the oxide semiconductor layer 104 is crystallized. With the provision of the crystal region 106, the breakdown voltage (e.g., drain breakdown voltage) of the semiconductor device can be further improved. Note that regions except the crystal region 106 in the oxide semiconductor layer 104 are preferably amorphous; however, such regions may contain crystal grains in amorphous regions or may be microcrystalline.

In the plan view, the conductive layer 116 functioning as a gate electrode is provided around the conductive layer 108 functioning as the other of the source electrode and the drain electrode and the conductive layer 112 electrically connected to the conductive layer 108, and the conductive layer 102 functioning as one of the source electrode and the drain electrode and the conductive layer 114 electrically connected to the conductive layer 102 are provided around the conductive layer 116 (see FIG. 1B).

In other words, the conductive layer 102 functioning as one of the source electrode and the drain electrode does not overlap with the conductive layer 108 functioning as the other of the source electrode and the drain electrode. Here, when it is described that "A does not overlap with B", A and B do not have a region where A occupies the same area as B in a plan view. The same can be said for the other portions in this specification.

Further, the conductive layer 116 functioning as a gate electrode is provided in a region having a region where the conductive layer 102 and the conductive layer 108 do not overlap with each other. That is, at least part of the conductive layer 116 does not overlap with the conductive layer 102 and the conductive layer 108. In contrast, the other part of the conductive layer 116 may overlap with the conductive layer 102 and the conductive layer 108.

Note that in FIGS. 1A and 1B, the conductive layer 108 and the conductive layer 112 are provided in the center, and the conductive layer 116, the conductive layer 102, and the conductive layer 114 are provided around the conductive layer 108 and the conductive layer 112; however, the layout of the semiconductor device is not limited to this. Arrangement of the components can be changed as appropriate within the bounds of not impairing the function of the semiconductor device.

The conductive layer 112 which is electrically connected to the conductive layer 108 functions as a terminal for electrically connecting the conductive layer 108 to an external wiring or the like; however, the conductive layer 112 is not necessarily provided as long as the conductive layer 108 can be directly connected to an external wiring or the like. The same can be said for the conductive layer 114. Note that in FIGS. 1A and 1B, an external wiring or the like which is electrically connected to the conductive layer 112 is not illustrated.

Details of the structure of a semiconductor device in this embodiment are described below with reference to FIGS. 1A and 1B.

<Substrate>

An insulating substrate, a semiconductor substrate, a metal substrate, or the like is used as the substrate 100. In addition, a substrate whose surface is covered with an insulating material or the like can be used. Note that the substrate 100 preferably has heat resistance high enough to withstand heating of the oxide semiconductor layer.

A glass substrate, a quartz substrate, or the like can be used as the insulating substrate. In addition, an insulating substrate including an organic material such as polyimide, polyamide, polyvinyl phenol, a benzocyclobutene resin, an acrylic resin, or an epoxy resin can be used. In the case where an insulating substrate including an organic material is used, it is necessary to select an insulating substrate which can withstand the highest temperature in a process.

A typical example of the semiconductor substrate is a silicon substrate (a silicon wafer). Although there are plural grades of silicon substrates, an inexpensive silicon substrate may be used as long as it has a certain level of flatness. For example, a silicon substrate with a purity of about 6N (99.9999%) to 7N (99.99999%) can be used.

Typical examples of the metal substrate are an aluminum substrate and a copper substrate. In the case where such a metal substrate is used, an insulating layer may be formed over a surface in order to secure insulating properties. Since the metal substrate has high thermal conductivity, the metal substrate is preferably used as a substrate of a high-power semiconductor device such as a power MOSFET with a high calorific value.

<Oxide Semiconductor Layer>

As an example of the semiconductor material of the oxide semiconductor layer 104, there is a semiconductor material represented by $InMO_3(ZnO)_m$ (m>0). Here, M denotes one or more metal elements selected from gallium (Ga), iron (Fe), nickel (Ni), manganese (Mn), cobalt (Co), or the like. For example, the case where Ga is selected as M includes not only the case where only Ga is used but also the case where Ga and the above metal element other than Ga, such as Ni or Fe, are used. Further, in the oxide semiconductor, in some cases, a transitional metal element such as Fe or Ni or an oxide of the transitional metal is contained as an impurity element in addition to the metal element contained as M. In this specification and the like, among the oxide semiconductors, an oxide semiconductor containing at least gallium as M is referred to as an In—Ga—Zn—O-based oxide semiconductor.

The In—Ga—Zn—O-based oxide semiconductor material has sufficiently high resistance when there is no electric field, can have sufficiently low off-state current, and has a large energy gap (a wide gap); thus, it is favorably used for a high-power semiconductor device such as a power MOSFET.

Note that as other examples of the semiconductor material of the oxide semiconductor layer 104, for example, there are an In—Sn—Zn—O-based oxide semiconductor material, an In—Al—Zn—O-based oxide semiconductor material, a Sn—Ga—Zn—O-based oxide semiconductor material, an Al—Ga—Zn—O-based oxide semiconductor material, a Sn—Al—Zn—O-based oxide semiconductor material, an In—Zn—O-based oxide semiconductor material, a Sn—Zn—O-based oxide semiconductor material, an Al—Zn—O-based oxide semiconductor material, an In—O-based oxide semiconductor material, a Sn—O-based oxide semiconductor material, a Zn—O-based oxide semiconductor material, and the like.

The oxide semiconductor layer 104 (excluding the crystal region 106) preferably has an amorphous structure; however, the oxide semiconductor layer 104 may have an amorphous structure containing a crystal grain, a microcrystalline structure, or the like. Further, the thickness of the oxide semiconductor layer 104 can be set as appropriate depending on a characteristic such as desired breakdown voltage. Specifically, the thickness of the oxide semiconductor layer 104 can be approximately 100 nm to 10 μm.

The crystal region 106 preferably has a structure where micro crystals (may be simply referred to as crystal grains) each having a size of 20 nm or less are arranged. For example, in the case where the oxide semiconductor layer 104 is formed using an In—Ga—Zn—O-based oxide semiconductor material, the crystal region 106 is a region where micro crystals of $In_2Ga_2ZnO_7$ are arranged in a predetermined direction. In particular, in the case where the micro crystals are arranged in such a manner that the c-axis of $In_2Ga_2ZnO_7$ is perpendicular to a plane of a substrate (or a surface of the oxide semiconductor layer), the breakdown voltage of the semiconductor device can be greatly improved, which is preferable. This results from the dielectric constant anisotropy of $In_2Ga_2ZnO_7$. Breakdown voltage in a b-axis direction (or an a-axis direction) can be improved as compared to that in a c-axis direction. Note that the size of the micro crystal is just an example, and the present invention is not construed as being limited to the above range.

Note that in the semiconductor device, the crystal region 106 is not an essential component. In the case where sufficiently high breakdown voltage can be secured with the use of an oxide semiconductor material, the crystal region 106 is not necessarily provided.

<Insulating Layer>

The insulating material of the insulating layer 110 functioning as a gate insulating layer can be selected from silicon oxide, silicon nitride, silicon oxynitride, silicon nitride oxide, aluminum oxide, tantalum oxide, or the like. Alternatively, a composite material of these materials may be used. The insulating layer 110 may have a single-layer structure or a layered structure including a layer formed using any of the above insulating materials. Note that in general, a MOSFET refers to a field effect transistor containing a metal, an oxide, and a semiconductor; however, an insulating layer used in the semiconductor device of the disclosed invention is not limited to an oxide.

Note that in this specification and the like, oxynitride refers to a substance that contains more oxygen (atoms) than nitrogen (atoms). For example, silicon oxynitride is a substance that contains oxygen, nitrogen, silicon, and hydrogen at concentrations ranging from 50 to 70 atomic %, 0.5 to 15 atomic %, 25 to 35 atomic %, and 0.1 to 10 atomic %, respectively. Further, nitride oxide refers to a substance that contains more nitrogen (atoms) than oxygen (atoms). For example, silicon nitride oxide contains oxygen, nitrogen, silicon, and hydrogen at concentrations ranging from 5 to 30 atomic %, 20 to 55 atomic %, 25 to 35 atomic %, and 10 to 25 atomic %, respectively. Note that the above concentrations are concentrations when measurement is performed using Rutherford backscattering spectrometry (RBS) or hydrogen forward scattering spectrometry (HFS). Furthermore, the total of the percentages of the constituent elements does not exceed 100 atomic %.

<Conductive Layer>

For example, the conductive layer 102 functions as the drain electrode; the conductive layer 108 functions as the source electrode; and the conductive layer 116 functions as the gate electrode. Although the conductive layer 112 and the conductive layer 114 function as terminals for realizing electrical connection to an external wiring or the like, the conductive layer 112 and the conductive layer 114 are not essential components.

The conductive material of each of the conductive layers can be selected from a metal material such as aluminum, copper, molybdenum, titanium, chromium, tantalum, tungsten, neodymium, or scandium; an alloy material containing any of these metal materials as its main component; a nitride containing any of these metal materials; or the like. Further, a light-transmitting oxide conductive material such as indium oxide, an alloy of indium oxide and tin oxide, an alloy of indium oxide and zinc oxide, zinc oxide, zinc aluminum oxide, zinc aluminum oxynitride, or zinc gallium oxide can be used. The conductive layer may have a single-layer structure or a layered structure including a layer formed using any of the above conductive materials.

The conductive layer 108 functioning as a source electrode is formed over the oxide semiconductor 104 and in contact with an upper surface of the oxide semiconductor layer 104. The conductive layer 102 functioning as a drain electrode is formed under the oxide semiconductor layer 104 and in contact with a lower surface of the oxide semiconductor layer 104. In addition, the conductive layer 116 functioning as a gate electrode is provided over the insulating layer 110 and generates an electric field in the oxide semiconductor layer 104.

Note that distinction between a source and a drain is made only for convenience, and the function of each component included in the semiconductor device should not be construed as being limited to the above names. This is because the functions of the source and the drain are switched with each other in accordance with the operation of the semiconductor device.

The operation of the semiconductor device in this embodiment is briefly described below.

<Operation of Semiconductor Device>

In the case of an n-type semiconductor device having electrons as carriers, in normal operation, a negative bias is applied to the conductive layer 108 functioning as a source electrode, and a positive bias is applied to the conductive layer 102 functioning as a drain electrode.

The oxide semiconductor layer 104 with sufficient thickness is provided between the conductive layer 108 functioning as a source electrode and the conductive layer 102 functioning as a drain electrode. In addition, the oxide semiconductor layer 104 is formed using an oxide semiconductor material which has a wide gap and sufficiently high resistance when there is no electric field. Therefore, in a condition that a negative bias is applied to the conductive layer 108 and a positive bias is applied to the conductive layer 102, a very small amount of current flows when a bias is not applied to the conductive layer 116 functioning as a gate electrode or a negative bias is applied to the conductive layer 116.

When a positive bias is applied to the conductive layer 116 functioning as a gate electrode, negative electric charge (an electron) is induced around an interface between the oxide semiconductor layer 104 and the insulating layer 110 in a region overlapping with the conductive layer 116, so that a channel is formed. Therefore, current flows between the conductive layer 108 functioning as a source electrode and the conductive layer 102 functioning as a drain electrode.

Since an oxide semiconductor is used as the semiconductor material in one embodiment of the disclosed invention, the breakdown voltage (e.g., drain breakdown voltage) of the semiconductor device can be improved. This results from a larger energy gap of the oxide semiconductor than that of a general semiconductor material.

Further, with the provision of the crystal region 106 where micro crystals are arranged in a predetermined direction, the breakdown voltage of the semiconductor device can be further improved. For example, in the case where the oxide semiconductor layer 104 is formed using an In—Ga—Zn—O-based oxide semiconductor material, the micro crystals are arranged in such a manner that the c-axis of $In_2Ga_2ZnO_7$ is perpendicular to the plane of the substrate (or the surface of the oxide semiconductor layer). A direction in which current flows in the semiconductor device is a b-axis direction (or an a-axis direction) of $In_2Ga_2ZnO_7$, so that the breakdown voltage of the semiconductor device can be improved. Note that the crystal of $In_2Ga_2ZnO_7$ is formed so as to have a layered structure of layers which are parallel to the a-axis or the b-axis. That is, the c-axis of $In_2Ga_2ZnO_7$ refers to a direction which is perpendicular to the layer included in the crystal of $In_2Ga_2ZnO_7$.

<Steps of Manufacturing Semiconductor Device>

Steps of manufacturing the semiconductor device illustrated in FIGS. 1A and 1B are described with reference to FIGS. 2A to 2E.

Figure 2A:
FIGS. 2A to 2E are cross-sectional views illustrating a method for manufacturing a semiconductor device.

First, the conductive layer 102 is formed over the substrate 100 (see FIG. 2A). The section <Substrate> can be referred to for details of the substrate 100.

The conductive layer 102 is formed in such a manner that a conductive layer containing the conductive material illustrated in the section <Conductive Layer> is deposited over the substrate 100 by a method such as sputtering or vacuum evaporation, and then, an unnecessary portion is removed by etching with the use of a resist mask formed by photolithography. The etching may be either wet etching or dry etching. Note that in order to improve coverage with each component formed over the conductive layer 102, the etching is preferably performed in such a manner that an angle between a side surface of the conductive layer 102 and a bottom surface of the conductive layer 102 is an acute angle.

In the case where the conductive layer 102 has a layered structure of a layer formed using a low-resistant conductive material such as aluminum or copper and a layer formed using a high-melting-point conductive material such as molybdenum, titanium, chromium, tantalum, tungsten, neodymium, or scandium, high conductivity and high heat resistance can be realized, which is preferable. For example, a two-layer structure of aluminum and molybdenum, a two-layer structure of copper and molybdenum, a two-layer structure of copper and titanium nitride, a two-layer structure of copper and tantalum nitride, or the like can be used. Further, a two-layer structure of titanium nitride and molybdenum may be used. Furthermore, a three-layer structure can be used in which aluminum, an alloy of aluminum and silicon, an alloy of aluminum and titanium, an alloy of aluminum and neodymium, or the like is sandwiched between layers of tungsten, tungsten nitride, titanium nitride, titanium, or the like.

Figure 2B:
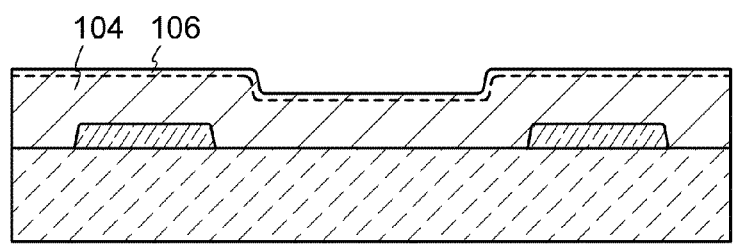

Next, the oxide semiconductor layer 104 including the crystal region 106 is formed so as to cover the conductive layer 102 (see FIG. 2B). Note that the oxide semiconductor layer 104 without the crystal region 106 may be formed.

The oxide semiconductor layer 104 is formed using any of the oxide semiconductor materials in the section <Oxide Semiconductor Layer>. The oxide semiconductor layer 104 can be deposited by sputtering or the like in a rare gas atmosphere which includes, for example, argon, an oxygen atmosphere, or a mixed gas atmosphere in which a rare gas and oxygen are mixed. In the sputtering, with the use of a target containing $SiO_2$ at 2 to 10 wt. %, $SiO_x$ (x>0) is contained in the oxide semiconductor layer 104, so that crystallization of the oxide semiconductor layer 104 can be suppressed. This method is effective in obtaining the oxide semiconductor layer 104 with an amorphous structure.

For example, an oxide semiconductor deposition target including In, Ga, and Zn (e.g., a target having a composition ratio of In:Ga:Zn=1:1:0.5 [atomic %], In:Ga:Zn=1:1:1 [atomic %], or In:Ga:Zn=1:1:2 [atomic %]) is used; a distance between the substrate and the target is 100 mm; pressure is 0.6 Pa; DC power is 0.5 kW; and the atmosphere is an oxygen (an oxygen flow rate ratio is 100%) atmosphere. Thus, an In—Ga—Zn—O-based amorphous oxide semiconductor layer can be obtained as the oxide semiconductor layer 104. Note that in the case where a pulse DC power source is used as a power source, a powdered substance (also referred to as a particle or dust) in deposition can be reduced and thickness distribution can be made uniform, which is preferable.

As described in the section <Oxide Semiconductor Layer>, the thickness of the oxide semiconductor layer 104 can be set as appropriate depending on a characteristic such as desired breakdown voltage. For example, the thickness of the oxide semiconductor layer 104 may be approximately 100 nm to 10 µm.

The crystal region 106 is formed through heat treatment performed after the formation of the oxide semiconductor layer 104. Note that $H_2$, H, OH, or the like contained in the oxide semiconductor layer 104 is eliminated through the heat treatment, so that the heat treatment may be referred to as dehydration treatment or dehydrogenation treatment.

As the heat treatment, RTA (rapid thermal annealing) treatment in which a high-temperature inert gas (e.g., nitrogen or a rare gas) is used can be used. Here, the temperature of the heat treatment is preferably 500° C. or higher. Although the upper limit of the heat treatment temperature is not particularly limited to a certain temperature, it is necessary to set the upper limit within the heat resistance of the substrate 100. In addition, time for the heat treatment is preferably 1 to 10 minutes. For example, RTA treatment is preferably performed at 650° C. for about 3 to 6 minutes. With the RTA treatment, heat treatment can be performed in a short time; thus, the adverse effect of heat on the substrate 100 can be reduced. In other words, it is possible to raise the upper limit of the heat treatment temperature as compared to the case where heat treatment is performed for a long time. Note that timing of the heat treatment is not limited to the above timing, and the heat treatment can be performed before or after a different step. Further, the number of the heat treatments is not limited to one, and the heat treatment may be performed more than once.

In the heat treatment, it is preferable that hydrogen (including water) or the like be not contained in a treatment atmosphere. For example, the purity of an inert gas introduced into a heat treatment apparatus is 6N (99.9999%, that is, the impurity concentration is 1 ppm or less) or more, preferably 7N (99.99999%, that is, the impurity concentration is 0.1 ppm or less) or more.

Through the heat treatment, the surface part in the oxide semiconductor layer 104 is crystallized, so that the crystal region 106 where micro crystals are arranged is formed. The other regions of the oxide semiconductor layer 104 have an amorphous structure, a structure where an amorphous structure and a microcrystalline structure are mixed with each other, or a microcrystalline structure. Note that the crystal region 106 is part of the oxide semiconductor layer 104, and the oxide semiconductor layer 104 includes the crystal region 106. Here, the thickness of the crystal region 106 is preferably 20 nm or less. This is because the properties of the semiconductor device depend on only the crystal region 106 when the crystal region is thick.

Note that it is important to prevent hydrogen (including water) from entering the oxide semiconductor layer 104 after the heat treatment. In order to prevent entry of hydrogen (including water), it is necessary that the substrate be not exposed to air at least in the heat treatment and a later cooling process. For example, this is realized when the heat treatment and the later cooling process are performed in the same atmosphere. Needless to say, the atmosphere of the cooling process may be different from the heat treatment atmosphere. In this case, the atmosphere of the cooling process can be, for example, an atmosphere of an oxygen gas, an $N_2O$ gas, or ultra-dry air (having a dew point of −40° C. or lower, preferably −60° C. or lower).

Figure 2C:
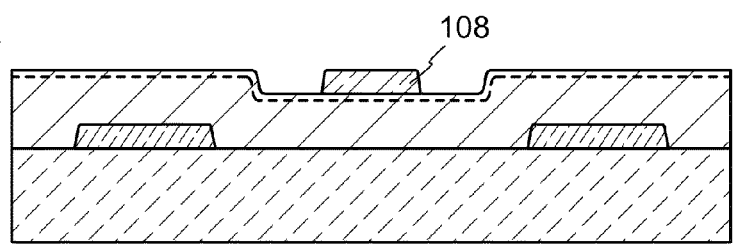

Next, the conductive layer 108 is formed in a region over the oxide semiconductor layer 104 that does not overlap with the conductive layer 102 (see FIG. 2C).

The conductive layer 108 can be formed in a manner similar to that of the conductive layer 102. In other words, the conductive layer 108 is formed in such a manner that a conductive layer is deposited by a method such as sputtering or vacuum evaporation, and then, an unnecessary portion is removed by etching with the use of a resist mask. The etching may be either wet etching or dry etching. In the case where the crystal region 106 is formed in the surface part of the oxide semiconductor layer 104, it is necessary that the crystal region 106 be not removed by the etching.

For example, in the case where a conductive material such as titanium is used for the conductive layer 108, wet etching in which a hydrogen peroxide solution or heated hydrochloric acid is used as an etchant is preferably used. When etching is performed under a condition that etching selectivity between the conductive material of the conductive layer 108 and the oxide semiconductor material is sufficiently high in this manner, the crystal region 106 in the surface part can remain.

Figure 2D:
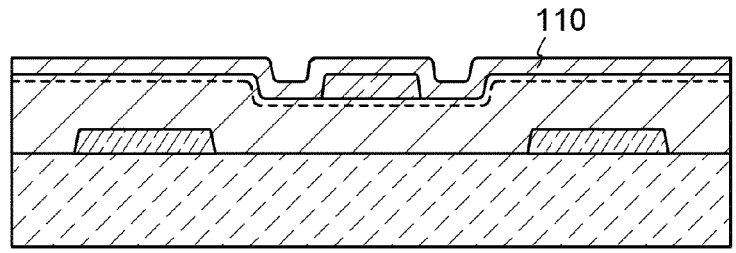

Next, the insulating layer 110 is formed so as to cover the oxide semiconductor layer 104 and the conductive layer 108 (see FIG. 2D).

The insulating layer 110 can be formed using the insulating material described in the section <Insulating Layer>, for example. As a deposition method, CVD, (including plasma-enhanced CVD), sputtering, or the like can be used. Note that the thickness of the insulating layer 110 can be set as appropriate depending on the properties of the semiconductor device; however, the thickness of the insulating layer 110 is preferably 10 nm to 1 μm.

Figure 2E:
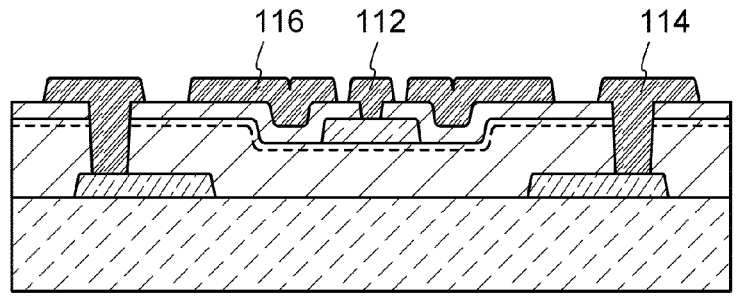

Then, openings which reach the conductive layer 102 and the conductive layer 108 are formed by selective removal of the insulating layer 110 or the like, and then, the conductive layer 112 which is electrically connected to the conductive layer 108, the conductive layer 114 which is electrically connected to the conductive layer 102, and the conductive layer 116 are formed (see FIG. 2E).

Removal of the insulating layer 110 or the like can be performed by etching with the use of a resist mask. The etching may be either wet etching or dry etching.

The conductive layers 112, 114, and 116 can be formed in a manner similar to those of the other conductive layers. In other words, each of the conductive layers 112, 114, and 116 is formed in such a manner that a conductive layer is deposited by a method such as sputtering or vacuum evaporation, and then, an unnecessary portion is removed by etching with the use of a resist mask. The etching may be either wet etching or dry etching.

As described above, a semiconductor device called a power MOSFET can be manufactured. As described in this embodiment, when an oxide semiconductor material is used for a semiconductor layer, the breakdown voltage of the semiconductor device is improved. In particular, when an oxide semiconductor layer having a crystal region is used, the breakdown voltage of the semiconductor device can be further improved. Further, since the oxide semiconductor layer is deposited using a productive method such as sputtering, the productivity of the semiconductor device can be increased and manufacturing cost can be reduced.

The structures, methods, and the like described in this embodiment can be combined with any of the other embodiments as appropriate.

Embodiment 2

In this embodiment, different examples of a semiconductor device and a manufacturing method thereof are described with reference to FIGS. 3A and 3B and FIGS. 4A to 4E. Note that a semiconductor device described in this embodiment and the semiconductor device in the aforementioned embodiment have a lot in common. Therefore, description of common portions is omitted, and differences are mainly described.

<Outline of Semiconductor Device>

Figure 3A:
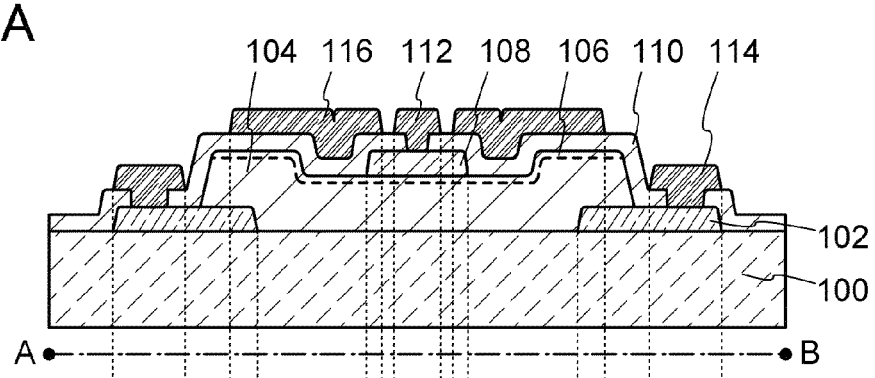
FIGS. 3A and 3B are a cross-sectional view and a plan view illustrating a structure of a semiconductor device.
Figure 3B:
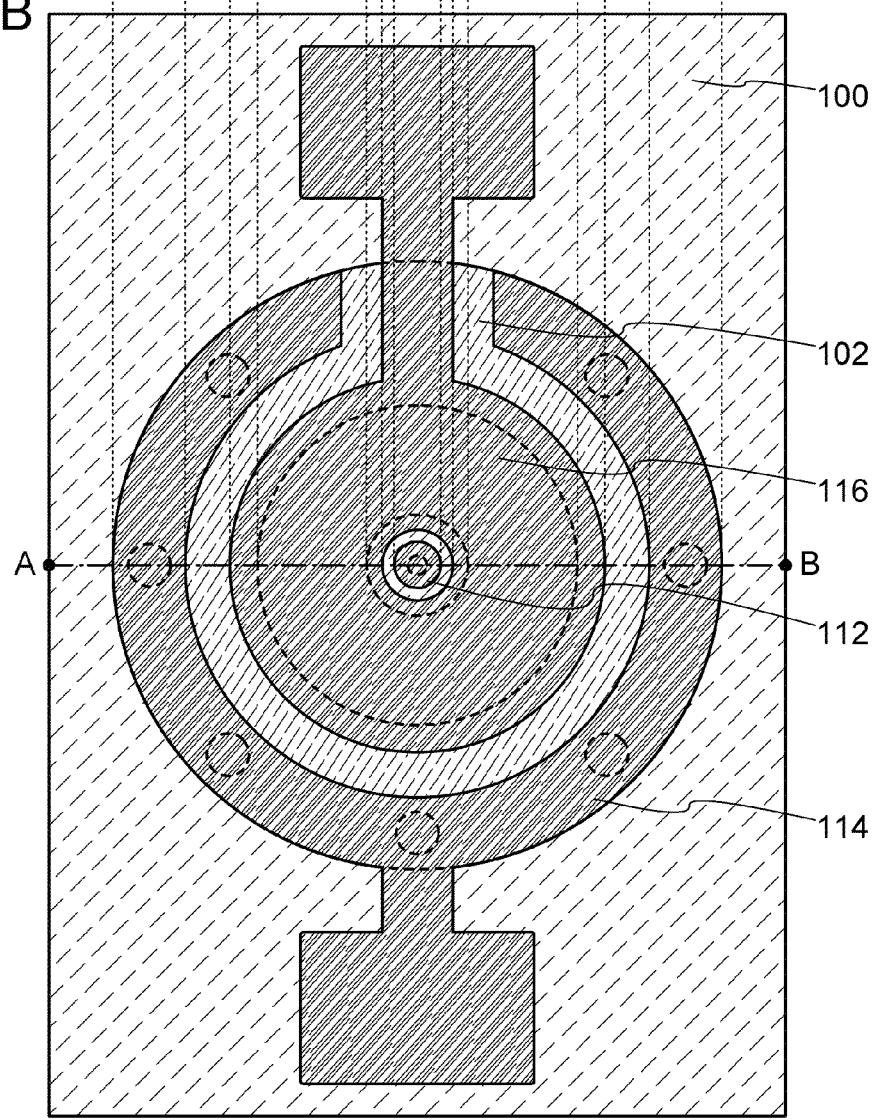

FIGS. 3A and 3B illustrate a different example of the structure of a semiconductor device. FIG. 3A corresponds to a cross-sectional view, and FIG. 3B corresponds to a plan view. Further, FIG. 3A corresponds to a cross section taken along line A-B in FIG. 3B.

The components of the semiconductor device illustrated in FIGS. 3A and 3B are similar to those of the semiconductor device illustrated in FIGS. 1A and 1B. In other words, the semiconductor device illustrated in FIGS. 3A and 3B includes the substrate 100, the conductive layer 102 functioning as one of the source electrode and the drain electrode, the oxide semiconductor layer 104, the crystal region 106 in the oxide semiconductor layer 104, the conductive layer 108 functioning as the other of the source electrode and the drain electrode, the insulating layer 110 functioning as a gate insulating layer, the conductive layer 112 electrically connected to the conductive layer 108, the conductive layer 114 electrically connected to the conductive layer 102, the conductive layer 116 functioning as a gate electrode, and the like.

The semiconductor device illustrated in FIGS. 3A and 3B differs from the semiconductor device illustrated in FIGS. 1A and 1B in that the oxide semiconductor layer 104 is patterned. Even in the case where the structure in FIGS. 3A and 3B is employed, the semiconductor device illustrated in FIGS. 3A and 3B operates in a manner similar to that of the semiconductor device illustrated in FIGS. 1A and 1B and advantageous effects similar to those of the semiconductor device illustrated in FIGS. 1A and 1B can be obtained.

<Steps of Manufacturing Semiconductor Device>

Steps of manufacturing the semiconductor device are basically similar to those in FIGS. 2A to 2E. The steps of manufacturing the semiconductor device are briefly described below with reference to FIGS. 4A to 4E.

Figure 4A:
FIGS. 4A to 4E are cross-sectional views illustrating a method for manufacturing a semiconductor device.

First, the conductive layer 102 is formed over the substrate 100 (see FIG. 4A). The aforementioned embodiment can be referred to for details.

Figure 4B:
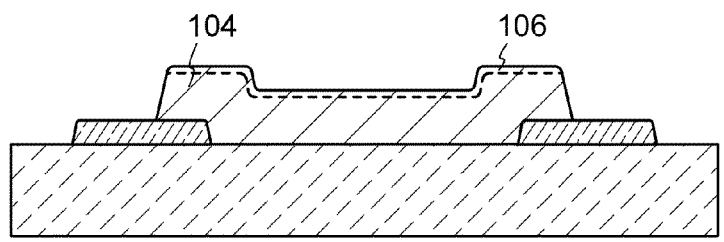

Next, the oxide semiconductor layer 104 including the crystal region 106 is formed so as to cover the conductive layer 102 (see FIG. 4B). The formation method of the oxide semiconductor layer 104 is similar to that in the aforementioned embodiment; however, the oxide semiconductor layer 104 in this embodiment differs from the oxide semiconductor layer 104 in the aforementioned embodiment in that it is formed so as to cover part of the conductive layer 102.

The oxide semiconductor layer 104 in this embodiment can be obtained in such a manner that an oxide semiconductor layer (including a crystal region) is deposited by the method illustrated in the aforementioned embodiment, for example, and then, the oxide semiconductor layer is patterned. Patterning can be performed by etching with the use of a resist mask. The etching may be either wet etching or dry etching; however, it is preferable to perform the etching so that the crystal region remains.

Figure 4C:
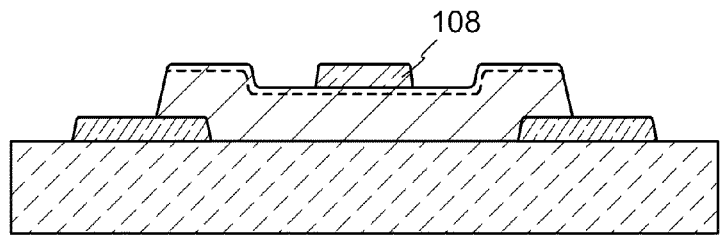

Next, the conductive layer 108 is formed in a region over the oxide semiconductor layer 104 that does not overlap with the conductive layer 102 (see FIG. 4C). The aforementioned embodiment can be referred to for details.

Figure 4D:
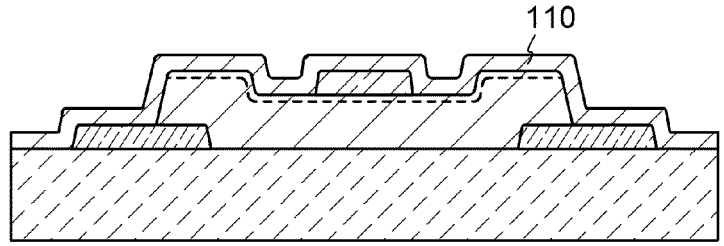

Next, the insulating layer 110 is formed so as to cover the oxide semiconductor layer 104 and the conductive layer 108 (see FIG. 4D). The aforementioned embodiment can be referred to for details of the insulating layer 110.

Figure 4E:
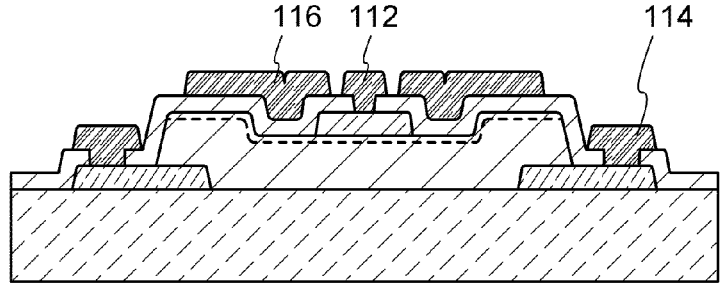

Then, openings which reach the conductive layer 102 and the conductive layer 108 are formed by selective removal of the insulating layer 110 or the like, and then, the conductive layer 112 which is electrically connected to the conductive layer 108, the conductive layer 114 which is electrically connected to the conductive layer 102, and the conductive layer 116 are formed (see FIG. 4E). The aforementioned embodiment can be referred to for details.

As described above, a semiconductor device called a power MOSFET can be manufactured. The structures, methods, and the like described in this embodiment can be combined with any of the other embodiments as appropriate.

Embodiment 3

In this embodiment, different examples of a semiconductor device and a manufacturing method thereof are described with reference to FIGS. 5A and 5B and FIGS. 6A to 6D. Note that a semiconductor device described in this embodiment and the semiconductor device in the aforementioned embodiment have a lot in common. Therefore, description of common portions is omitted, and differences are mainly described.

<Outline of Semiconductor Device>

Figure 5A:
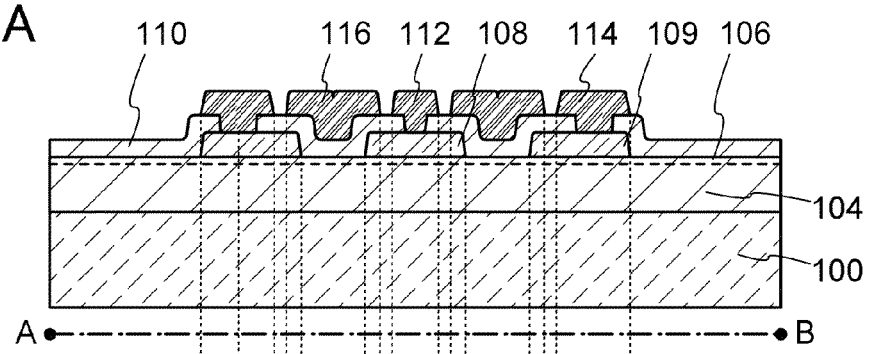
FIGS. 5A and 5B are a cross-sectional view and a plan view illustrating a structure of a semiconductor device.
Figure 5B:
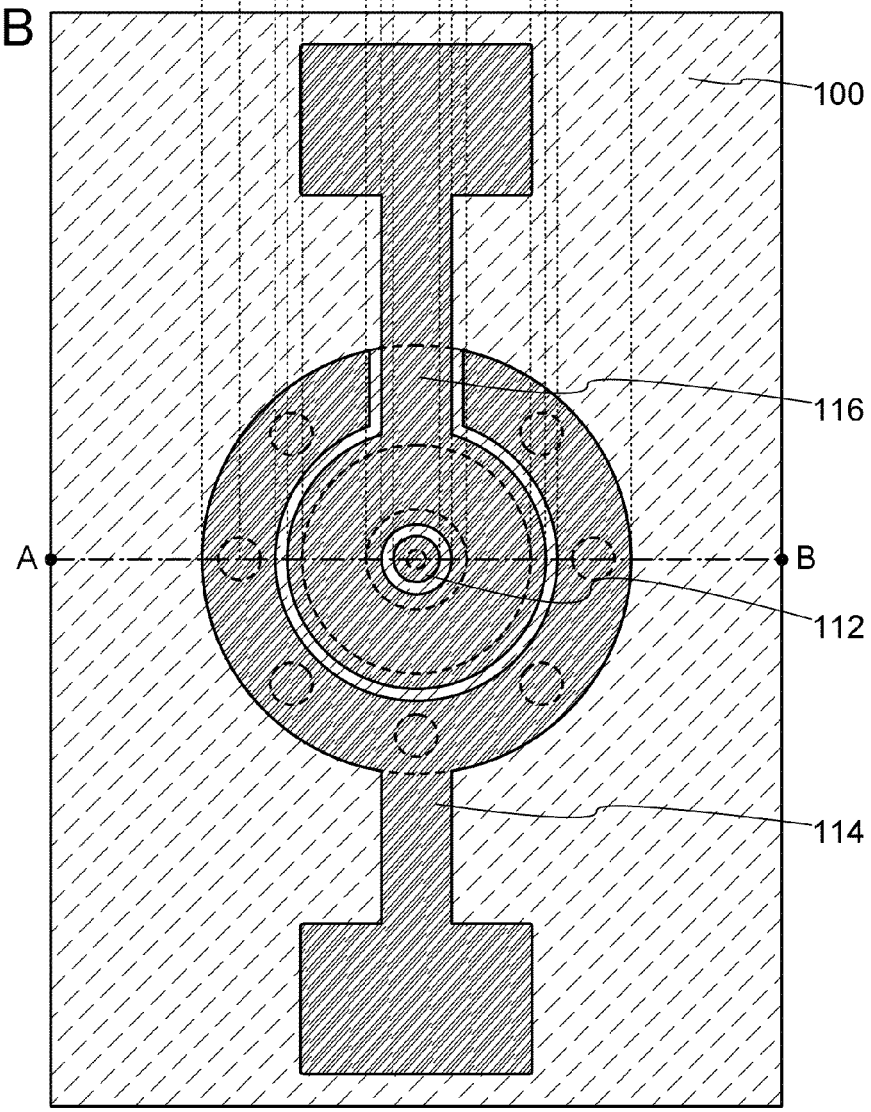

FIGS. 5A and 5B illustrate a different example of the structure of a semiconductor device. FIG. 5A corresponds to a cross-sectional view, and FIG. 5B corresponds to a plan view. Further, FIG. 5A corresponds to a cross section taken along line A-B in FIG. 5B.

The semiconductor device illustrated in FIGS. 5A and 5B corresponds to a semiconductor device where the conductive layer 102 in the semiconductor device described in the aforementioned embodiment is replaced with a conductive layer 109. In other words, the semiconductor device illustrated in FIGS. 5A and 5B includes the substrate 100, the conductive layer 109 functioning as one of a source electrode and a drain electrode, the oxide semiconductor layer 104, the crystal region 106 in the oxide semiconductor layer 104, the conductive layer 108 functioning as the other of the source electrode and the drain electrode, the insulating layer 110 functioning as a gate insulating layer, the conductive layer 112 electrically connected to the conductive layer 108, the conductive layer 114 electrically connected to the conductive layer 109, the conductive layer 116 functioning as a gate electrode, and the like.

The conductive layer 109 is formed using the same layer as the conductive layer 108. By replacement of the conductive layer 102 with the conductive layer 109, all the conductive layers are provided over the oxide semiconductor layer 104. Thus, flatness of a surface of the oxide semiconductor layer 104 is improved.

With the above structure, unlike the semiconductor device described in the aforementioned embodiment, carriers flow to only a surface part (i.e., the crystal region 106) of the oxide semiconductor layer 104. Therefore, advantageous effects of the crystal region 106 are more significant.

<Steps of Manufacturing Semiconductor Device>

Steps of manufacturing the semiconductor device are similar to those in FIGS. 2A to 2E and FIGS. 4A to 4E except that the conductive layer 102 is not formed and that the conductive layer 109 is formed at the same time as the conductive layer 108. The steps of manufacturing the semiconductor device are briefly described below with reference to FIGS. 6A to 6D.

Figure 6A:
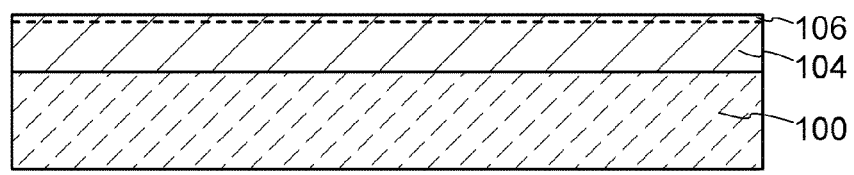
FIGS. 6A to 6D are cross-sectional views illustrating a method for manufacturing a semiconductor device.

First, the oxide semiconductor layer 104 is formed over the substrate 100 (see FIG. 6A). The aforementioned embodiment can be referred to for details of the formation and the like of the oxide semiconductor layer 104.

Figure 6B:
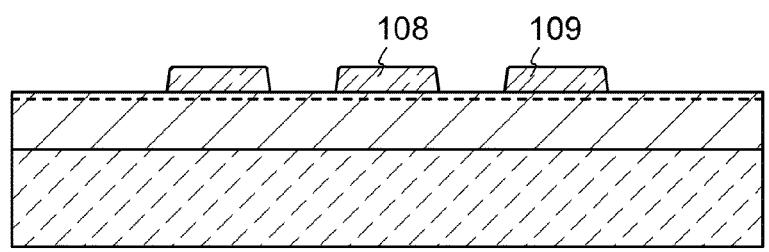

Next, the conductive layer 108 and the conductive layer 109 are formed over the oxide semiconductor layer 104 (see FIG. 6B). The conductive layer 109 can be formed in a manner similar to that of the conductive layer 108. It should be noted that the conductive layer 108 and the conductive layer 109 are separated from each other. The aforementioned embodiment can be referred to for details of the formation and the like of the conductive layer 108.

Figure 6C:
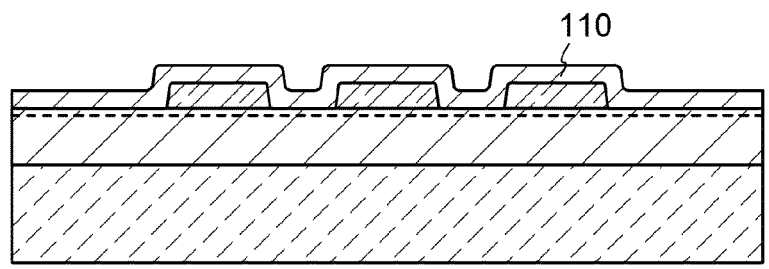

Next, the insulating layer 110 is formed so as to cover the oxide semiconductor layer 104, the conductive layer 108, and the conductive layer 109 (see FIG. 6C). The aforementioned embodiment can be referred to for details of the insulating layer 110.

Figure 6D:
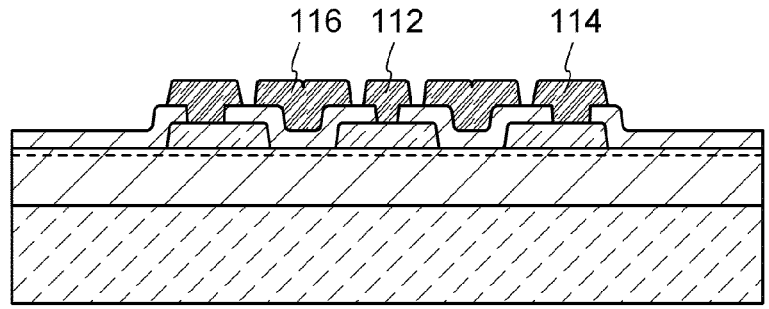

Then, openings which reach the conductive layer 108 and the conductive layer 109 are formed by selective removal of the insulating layer 110 or the like, and then, the conductive layer 112 which is electrically connected to the conductive layer 108, the conductive layer 114 which is electrically connected to the conductive layer 109, and the conductive layer 116 are formed (see FIG. 6D). The aforementioned embodiment can be referred to for details.

As described above, a semiconductor device called a power MOSFET can be manufactured. The structures, methods, and the like described in this embodiment can be combined with any of the other embodiments as appropriate.

Embodiment 4

In this embodiment, an example of a method for manufacturing a so-called power MOSFET and a thin film transistor over the same substrate and in similar steps is described with reference to FIGS. 7A to 7C and FIGS. 8A and 8B. Note that an example is described below in which the semiconductor device illustrated in FIGS. 1A and 1B is formed as a power MOSFET.

Steps of manufacturing the semiconductor device illustrated in this embodiment correspond to steps obtained by addition of a step of manufacturing a thin film transistor to the steps in FIGS. 2A to 2E. That is, basic manufacturing steps are similar to those illustrated in FIGS. 2A to 2E. Note that the power MOSFET and the thin film transistor generally have different required properties. The size or the like of the power MOSFET and the thin film transistor is preferably set as appropriate depending on the required properties. Although the power MOSFET and the thin film transistor are illustrated on approximately the same scale in FIGS. 7A to 7C and FIGS.

8A and 8B, such a scale is used to facilitate understanding and does not define the relationship of the real size.

First, the conductive layer 102 is formed over the substrate 100 (see FIG. 7A). The aforementioned embodiment can be referred to for details.

Next, the oxide semiconductor layer 104 including the crystal region 106 is formed so as to cover the conductive layer 102, and an oxide semiconductor layer 204 including a crystal region 206 that is a component of the thin film transistor is formed (see FIG. 7B). Each of the oxide semiconductor layers 104 and 204 can be obtained in such a manner that an oxide semiconductor layer (including a crystal region) is deposited by the method illustrated in the aforementioned embodiment, for example, and then, the oxide semiconductor layer is patterned. Patterning can be performed by etching with the use of a resist mask. The etching may be either wet etching or dry etching; however, it is preferable to perform the etching so that the crystal region in the oxide semiconductor layer remains.

Then, the conductive layer 108 is formed in a region over the oxide semiconductor layer 104 that does not overlap with the conductive layer 102, and conductive layers 208 and 209 are formed over the oxide semiconductor layer 204 (see FIG. 7C). Here, the conductive layer 208 functions as one of a source electrode and a drain electrode of the thin film transistor, and the conductive layer 209 functions as the other of the source electrode and the drain electrode of the thin film transistor. Steps of manufacturing the conductive layers 208 and 209 are similar to those of the conductive layer 108. The aforementioned embodiment can be referred to for details of the steps of manufacturing the conductive layer 108.

Next, the insulating layer 110 is formed so as to cover the oxide semiconductor layer 104, the conductive layer 108, the oxide semiconductor layer 204, the conductive layer 208, and the conductive layer 209 (see FIG. 8A). The insulating layer 110 functions also as a gate insulating layer of the thin film transistor. The aforementioned embodiment can be referred to for details of the steps of manufacturing the insulating layer 110.

Then, openings which reach the conductive layer 102, the conductive layer 108, the conductive layer 208, and the conductive layer 209 are formed by selective removal of the insulating layer 110 or the like, and then, the conductive layer 112 which is electrically connected to the conductive layer 108, the conductive layer 114 which is electrically connected to the conductive layer 102, the conductive layer 116, a conductive layer 212 which is electrically connected to the conductive layer 208, a conductive layer 214 which is electrically connected to the conductive layer 209, and a conductive layer 216 are formed (see FIG. 8B). Steps of manufacturing the conductive layers 212, 214, and 216 are similar to those of the conductive layers 112, 114, and 116. The aforementioned embodiment can be referred to for details.

In this manner, the power MOSFET and the thin film transistor can be formed over the same substrate and in similar steps.

With the method and the like illustrated in this embodiment, the power MOSFET and the thin film transistor can be formed over the same substrate and in similar steps. Therefore, a variety of integrated circuits and a power circuit can be formed over the same substrate.

Note that in this embodiment, the oxide semiconductor layer 104 of the power MOSFET and the oxide semiconductor layer 204 of the thin film transistor are formed in the same steps; however, the required thickness of the oxide semiconductor layer is different between the power MOSFET and the thin film transistor in some cases. Therefore, the oxide semiconductor layer 104 and the oxide semiconductor layer 204 may be formed in different steps. Specifically, the oxide semiconductor layer 104 and the oxide semiconductor layer 204 may be formed as follows. Steps of manufacturing the oxide semiconductor layers are divided into two stages; one of the oxide semiconductor layer 104 and the oxide semiconductor layer 204 is manufactured in a first stage; and the other of the oxide semiconductor layer 104 and the oxide semiconductor layer 204 is manufactured in a second stage. Alternatively, a thick oxide semiconductor layer is selectively made thin by etching or the like so that the oxide semiconductor layer 104 and the oxide semiconductor layer 204 are manufactured.

The same can be said for the insulating layer 110. The insulating layers 110 of the power MOSFET and the thin film transistor are separately formed so as to have different thicknesses. Specifically, the insulating layers 110 are formed as follows. Steps of manufacturing the insulating layers are divided into two stages; one of an insulating layer formed over the oxide semiconductor layer 104 and an insulating layer formed over the oxide semiconductor layer 204 is manufactured in a first stage; and the other of the insulating layer formed over the oxide semiconductor layer 104 and the insulating layer formed over the oxide semiconductor layer 204 is manufactured in a second stage. Alternatively, a thick insulating layer is selectively made thin by etching or the like so that the insulating layer formed over the oxide semiconductor layer 104 and the insulating layer formed over the oxide semiconductor layer 204 are manufactured.

The structures, methods, and the like described in this embodiment can be combined with any of the other embodiments as appropriate.

Embodiment 5

In this embodiment, an example of a circuit including a semiconductor device of the disclosed invention is described with reference to FIG. 9 and FIGS. 10A to 10C. Note that a DC-DC converter, which is an example of a power circuit (e.g., a power conversion circuit), is described below.

The DC-DC converter is a circuit for converting DC voltage into different DC voltage. Typical conversion methods of the DC-DC converter are a linear method and a switching method. Since a switching-type DC-DC converter has high conversion efficiency, such a DC-DC converter is preferable when power saving of an electronic device is to be achieved. Here, a switching-type DC-DC converter, especially a chopper DC-DC converter is described.

Figure 9:
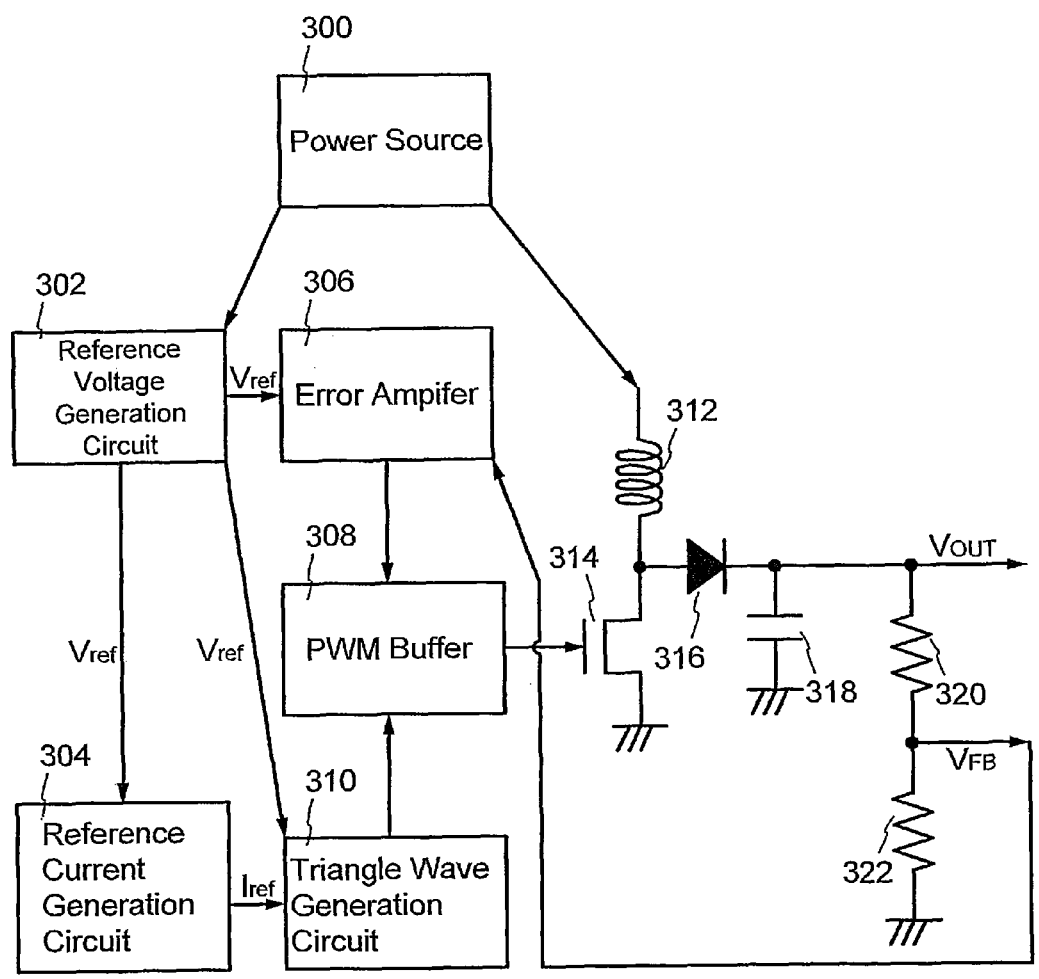
FIG. 9 illustrates an example of a structure of a DC-DC converter.

A DC-DC converter illustrated in FIG. 9 includes a power source 300, a reference voltage generation circuit 302, a reference current generation circuit 304, an error amplifier 306, a PWM buffer 308, a triangle wave generation circuit 310, a coil 312, a power MOSFET 314, a diode 316, a capacitor 318, a resistor 320, a resistor 322, and the like. Note that here, an n-channel power MOSFET is used as the power MOSFET 314.

The reference voltage generation circuit 302 generates a variety of reference voltages ($V_{ref}$). In addition, the reference current generation circuit 304 generates reference current ($I_{ref}$) or bias current with the use of reference voltage ($V_{ref}$) generated in the reference voltage generation circuit 302.

The error amplifier 306 integrates a difference between the reference voltage ($V_{ref}$) generated in the reference voltage generation circuit 302 and feedback voltage ($V_{FB}$) and outputs the value of integral to the PWM buffer 308. The triangle wave generation circuit 310 generates a triangle wave from the reference voltage ($V_{ref}$) and the reference current ($I_{ref}$) and outputs the triangle wave to the PWM buffer 308.

The PWM buffer 308 compares an output from the error amplifier 306 and the triangle wave from the triangle wave generation circuit 310 and outputs a pulse signal to the power MOSFET 314.

In the case where the pulse signal from the PWM buffer 308 has a high potential, the n-channel power MOSFET 314 is turned on, and the potential of an input side of the diode 316 becomes a ground potential (a low potential). Therefore, in a period during which the pulse signal has a high potential, output voltage ($V_{OUT}$) is gradually lowered.

In contrast, in the case where the pulse signal from the PWM buffer 308 has a low potential, the n-channel power MOSFET 314 is turned off, and the potential of the input side of the diode 316 rises. Therefore, in a period during which the pulse signal has a low potential, the output voltage ($V_{OUT}$) is gradually increased.

Changes in the output voltage ($V_{OUT}$) due to the pulse signal from the PWM buffer 308 are very small. Thus, with the DC-DC converter, the level of the output voltage can be kept substantially constant.

Note that in the DC-DC converter, the coil 312 is provided for reducing changes in current due to switching of the power MOSFET 314. Further, the capacitor 318 is provided for suppressing drastic fluctuation in the output voltage ($V_{OUT}$). Furthermore, the resistors 320 and 322 are provided for generating the feedback voltage ($V_{FB}$) from the output voltage ($V_{OUT}$).

Figure 10A:
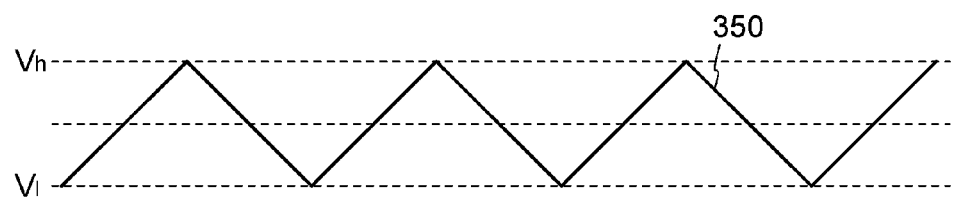
FIGS. 10A to 10C illustrate examples of output waveforms of a circuit included in a DC-DC converter.
Figure 10B:
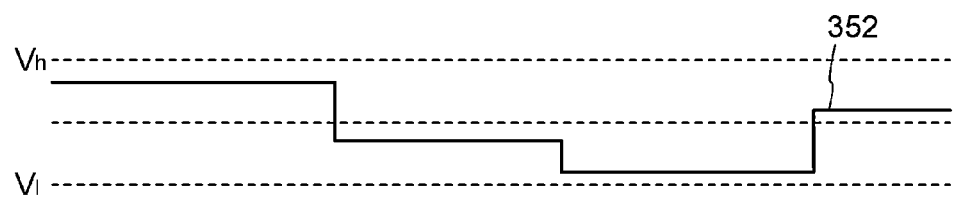
Figure 10C:
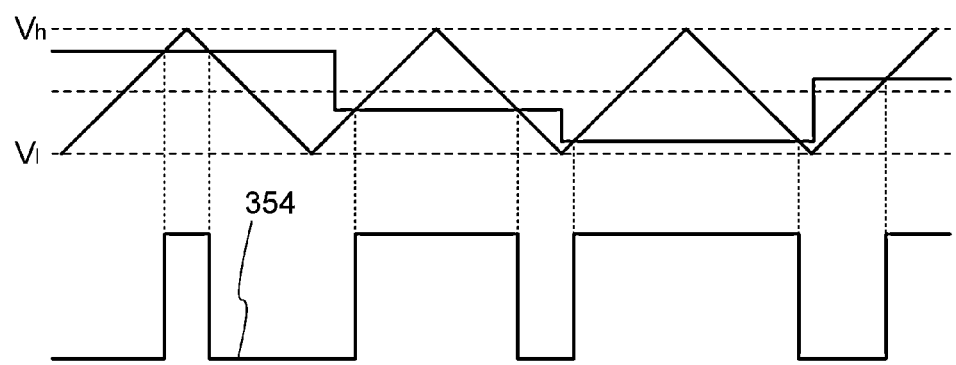

FIGS. 10A to 10C illustrate examples of output waveforms of circuits included in the DC-DC converter.

FIG. 10A illustrates a triangle wave 350 output from the triangle wave generation circuit 310. FIG. 10B illustrates an output waveform 352 from the error amplifier 306.

FIG. 10C illustrates a pulse signal 354 generated in the PWM buffer 308. When the triangle wave 350 and the output waveform 352 are input to the PWM buffer 308, the PWM buffer 308 compares these waves with each other and generates the pulse signal 354. Then, the pulse signal 354 is output to the power MOSFET 314 and the level of the output voltage ($V_{OUT}$) is determined.

As described above, a power MOSFET of the disclosed invention can be applied to a DC-DC converter. The power MOSFET of the disclosed invention has high breakdown voltage, and the reliability of a DC-DC converter including the power MOSFET can be improved. Further, the manufacturing cost of the power MOSFET of the disclosed invention is suppressed, so that the manufacturing cost of the DC-DC converter including the power MOSFET is suppressed. By using the semiconductor device of the disclosed invention in an electronic circuit in this manner, advantageous effects such as improvement in reliability and reduction in manufacturing cost can be obtained.

Note that the DC-DC converter illustrated in this embodiment is just an example of a power circuit including the semiconductor device of the disclosed invention. Needless to say, the semiconductor device of the disclosed invention can be used in a different circuit. The structures, methods, and the like described in this embodiment can be combined with any of the other embodiments as appropriate.

Embodiment 6

In this embodiment, an example of a solar photovoltaic system provided with an inverter formed using a semiconductor device of the disclosed invention is described with reference to FIG. 11. Note that here, an example of the structure of a household solar photovoltaic system is described.

Figure 11:
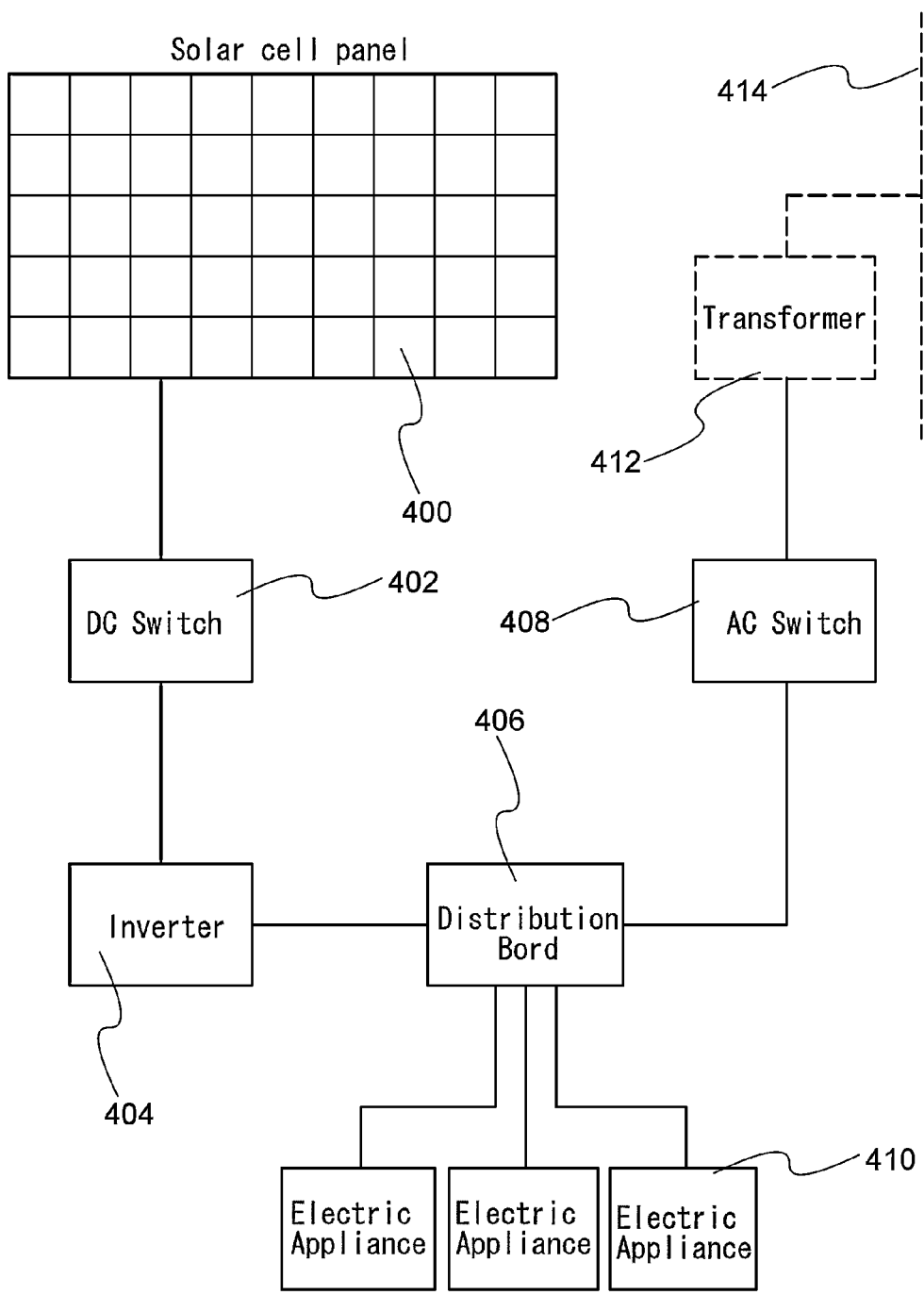
FIG. 11 illustrates an example of a solar photovoltaic system provided with an inverter.
Figure 12A:
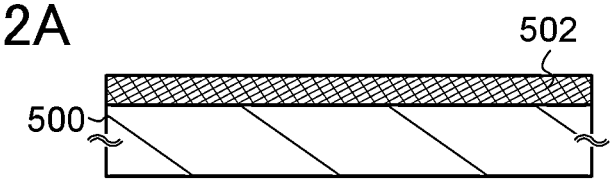
FIGS. 12A to 12F are cross-sectional views illustrating a method for manufacturing a semiconductor device.
Figure 12B:
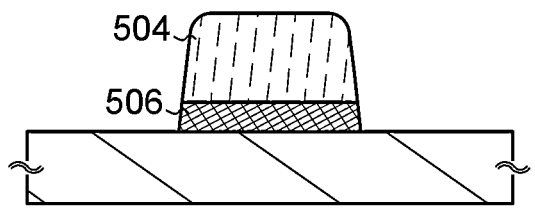
Figure 12C:
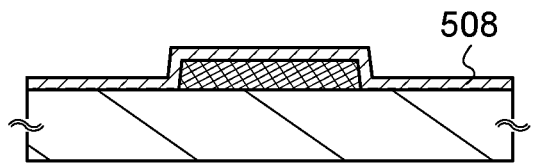
Figure 12D:
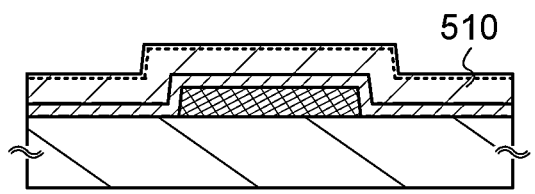
Figure 12E:
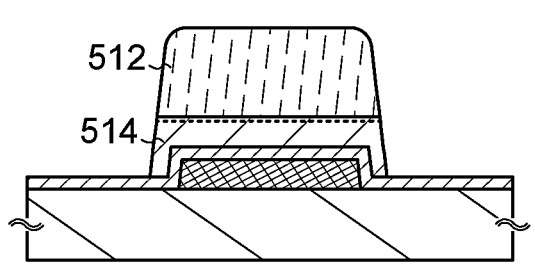
Figure 12F:
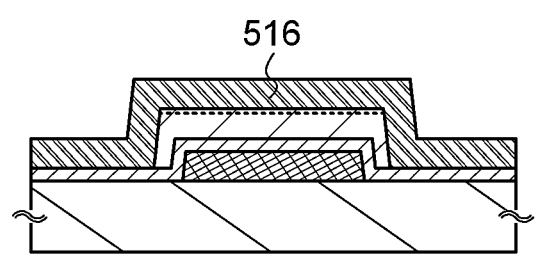

The household solar photovoltaic system illustrated in FIG. 11 is a system where a method for supplying power is changed depending on the condition of photovoltaic power generation. For example, when photovoltaic power generation is performed (e.g., in the case of a clear sky), power generated by photovoltaic power generation is consumed at home, and surplus power is supplied to a distribution line 414 from a power company. In contrast, when the amount of power generated by photovoltaic power generation is insufficient (e.g., in the case of night or rain), electricity is supplied from the distribution line 414 and is consumed at home.

The household solar photovoltaic system illustrated in FIG. 11 includes a solar cell panel 400 for converting sunlight into power (DC power), an inverter 404 for converting the DC power into AC power, and the like. AC power output from the inverter 404 is used as power for operating a variety of electric appliances 410.

Surplus power is supplied to the outside of home through the distribution line 414. That is, it is possible to sell power with the use of the system. A DC switch 402 is provided for selecting whether the solar cell panel 400 and the inverter 404 are connected or disconnected to each other. An AC switch 408 is provided for selecting whether a transformer 412 which is connected to the distribution line 414 and a distribution board 406 are connected or disconnected to each other.

By application of the semiconductor device of the disclosed invention to the inverter, it is possible to realize an inexpensive solar photovoltaic system with high reliability.

The structures, methods, and the like described in this embodiment can be combined with any of the other embodiments as appropriate.

Embodiment 7

In this embodiment, examples of a transistor (especially, a thin film transistor) as a semiconductor device and a manufacturing method thereof are described with reference to FIGS. 12A to 12F and FIGS. 13A to 13E. Note that a semiconductor device described below is a semiconductor device with a novel structure. An oxide semiconductor layer having a crystal region in a surface part is used in the semiconductor device. The semiconductor device controls current with two conductive layers.

First, a conductive layer 502 is deposited over a substrate 500 (see FIG. 12A), and a resist mask 504 is selectively formed over the conductive layer 502. Then, the conductive layer 502 is selectively etched using the resist mask 504, so that a conductive layer 506 is formed (see FIG. 12B). After the resist mask 504 is removed, an insulating layer 508 is formed so as to cover the conductive layer 506 (see FIG. 12C). Here, the conductive layer 506 has a function of controlling an electric field in an oxide semiconductor layer. Further, the conductive layer 506 has a function of blocking an external electric field which adversely affects the operation of a transistor. The aforementioned embodiments (e.g., Embodiments 1 to 3) can be referred to for materials, manufacturing methods, and the like of the components.

Note that although an example where the conductive layer 506 is formed by selective etching of the conductive layer 502 is described above, the conductive layer 506 may be formed over the entire upper surface of the substrate. Alternatively, the conductive layer 506 may be formed below the entire lower surface of the oxide semiconductor layer.

Next, an oxide semiconductor layer 510 is deposited over the insulating layer 508 (see FIG. 12D), and a resist mask 512 is selectively formed over the oxide semiconductor layer 510. Then, the oxide semiconductor layer 510 is selectively etched using the resist mask 512, so that an oxide semiconductor layer 514 is formed (see FIG. 12E). Note that after the oxide semiconductor layer 514 is formed, the resist mask 512 is removed. The aforementioned embodiment can be referred to for details of the oxide semiconductor layer. Further, the aforementioned embodiment can be referred to for details of the other components. The thickness of the oxide semiconductor layer 510 can be set as appropriate depending on a desired property. In the case where the oxide semiconductor layer 510 is used for a thin film transistor, for example, the thickness of the oxide semiconductor layer 510 is preferably about 20 nm to 2 μm.

Next, a conductive layer 516 is deposited so as to cover the oxide semiconductor layer 514 (see FIG. 12F), and a resist mask 518 and a resist mask 520 are selectively formed over the conductive layer 516. Then, the conductive layer 516 is selectively etched using the resist masks, so that a conductive layer 522 which functions as one of a source electrode and a drain electrode and a conductive layer 524 which functions as the other of the source electrode and the drain electrode are formed (see FIG. 13A). Note that after the conductive layer 522 and the conductive layer 524 are formed, the resist mask 518 and the resist mask 520 are removed. The aforementioned embodiment can be referred to for details of the above components.

Figure 13A:
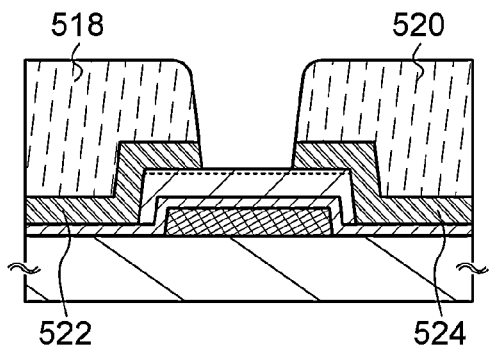
FIGS. 13A to 13E are cross-sectional views illustrating a method for manufacturing a semiconductor device.
Figure 13B:
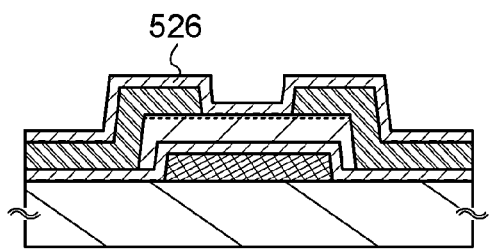
Figure 13C:
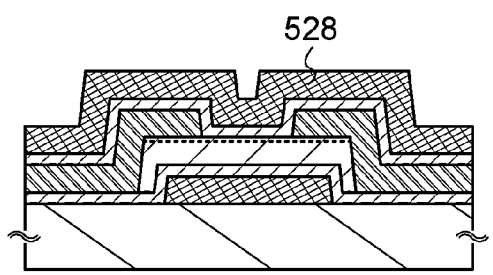
Figure 13D:
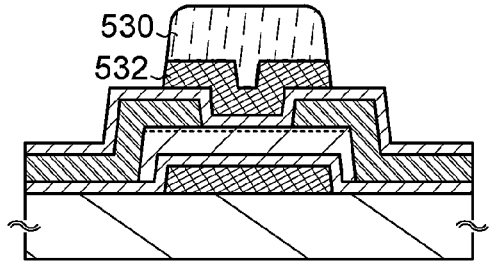

Next, an insulating layer 526 which functions as a gate insulating layer is formed so as to cover the oxide semiconductor layer 514, the conductive layer 522, and the conductive layer 524 (see FIG. 13B). Then, a conductive layer 528 is deposited over the insulating layer 526 (see FIG. 13C), and a resist mask 530 is selectively formed over the conductive layer 528. After that, the conductive layer 528 is selectively etched using the resist mask 530, so that a conductive layer 532 which functions as a gate electrode is formed (see FIG. 13D). After the conductive layer 532 is formed, the resist mask 530 is removed. The aforementioned embodiment can be referred to for details of the above components.

Figure 13E:
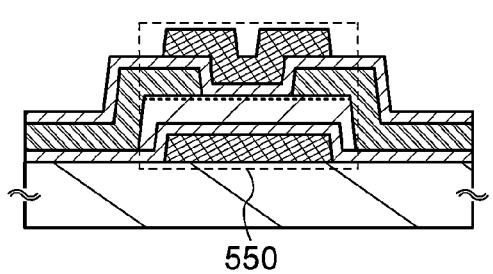
Figure 14A:
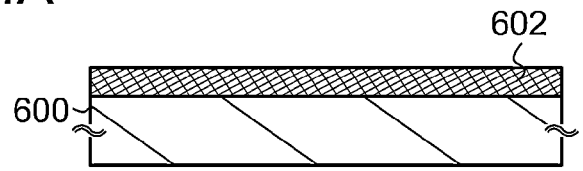
FIGS. 14A to 14F are cross-sectional views illustrating a method for manufacturing a semiconductor device.
Figure 14B:
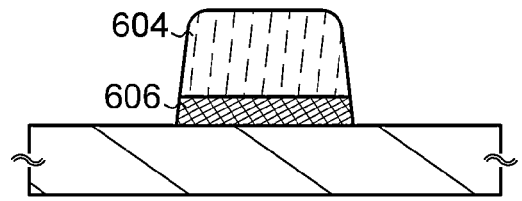
Figure 14C:
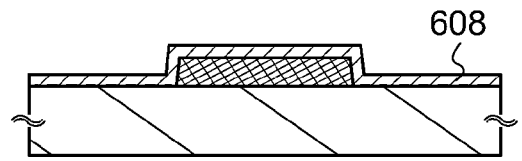
Figure 14D:
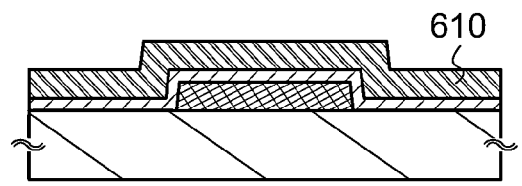
Figure 14E:
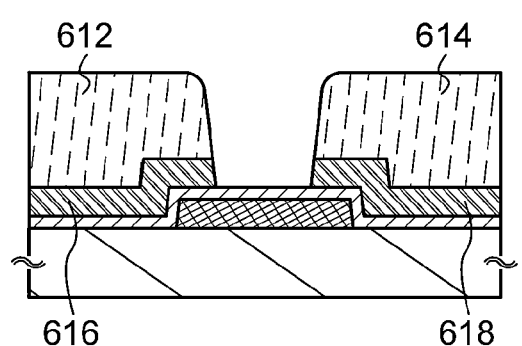
Figure 14F:
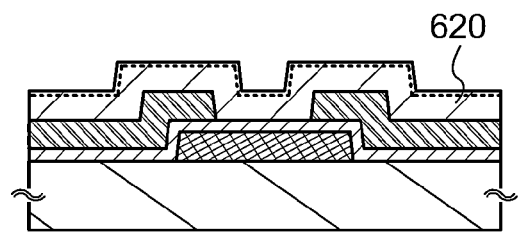

In this manner, a transistor 550 which includes the conductive layer 506 formed over the substrate 500, the insulating layer 508 which covers the conductive layer 506, the oxide semiconductor layer 514 formed over the insulating layer 508 that overlaps with part of the conductive layer 506 and has a crystal region in a surface part, the conductive layers 522 and 524 formed in contact with the oxide semiconductor layer 514, the insulating layer 526 which covers the oxide semiconductor layer 514 and the conductive layers 522 and 524, and the conductive layer 532 formed over the insulating layer 526 that overlaps with part of the oxide semiconductor layer 514, is provided (see FIG. 13E). Note that it can be said that the transistor 550 is a novel semiconductor device because an oxide semiconductor layer having a crystal region in a surface part is used and current is controlled with two conductive layers.

When a semiconductor device is manufactured using the oxide semiconductor layer described in the aforementioned embodiment as described in this embodiment, an impurity (e.g., hydrogen (including water)) can be prevented from entering the oxide semiconductor layer. Therefore, the reliability of the semiconductor device can be improved.

In addition, when a semiconductor device is manufactured using the oxide semiconductor layer described in the aforementioned embodiment, it is possible to provide a semiconductor device with favorable electrical characteristics.

Further, by employing a structure where a conductive layer is formed below an oxide semiconductor layer in addition to a conductive layer functioning as a so-called gate electrode, an external electric field can be blocked, so that the adverse effect of the external electric field on the semiconductor device can be reduced. Therefore, generation of parasitic channels due to accumulation of electric charge on the substrate side of the oxide semiconductor layer and fluctuation in the threshold voltage can be prevented.

The structures, methods, and the like described in this embodiment can be combined with any of the structures, methods, and the like described in the other embodiments as appropriate.

Embodiment 8

In this embodiment, examples of a transistor as a semiconductor device and a manufacturing method thereof are described with reference to FIGS. 14A to 14F and FIGS. 15A to 15E.

First, a conductive layer 602 is deposited over a substrate 600 (see FIG. 14A), and a resist mask 604 is selectively formed over the conductive layer 602. Then, the conductive layer 602 is selectively etched using the resist mask 604, so that a conductive layer 606 is formed (see FIG. 14B). After the resist mask 604 is removed, an insulating layer 608 is formed so as to cover the conductive layer 606 (see FIG. 14C). Here, the conductive layer 606 has a function of controlling an electric field in an oxide semiconductor layer. Further, the conductive layer 606 has a function of blocking an external electric field which adversely affects the operation of a transistor. The aforementioned embodiments (e.g., Embodiments 1 to 3) can be referred to for materials, manufacturing methods, and the like of the components.

Note that although an example where the conductive layer 606 is formed by selective etching of the conductive layer 602 is described above, the conductive layer 606 may be formed over the entire upper surface of the substrate. Alternatively, the conductive layer 606 may be formed below the entire lower surface of the oxide semiconductor layer.

Next, a conductive layer 610 is deposited over the insulating layer 608 (see FIG. 14D), and a resist mask 612 and a resist mask 614 are selectively formed over the conductive layer 610. Then, the conductive layer 610 is selectively etched using the resist masks, so that a conductive layer 616 which functions as one of a source electrode and a drain electrode and a conductive layer 618 which functions as the other of the source electrode and the drain electrode are formed (see FIG. 14E). Note that after the conductive layer 616 and the conductive layer 618 are formed, the resist mask 612 and the resist mask 614 are removed. The aforementioned embodiment can be referred to for details of the above components.

Next, an oxide semiconductor layer 620 is deposited so as to cover the conductive layer 616 and the conductive layer 618 (see FIG. 14F), and a resist mask 622 is selectively formed over the oxide semiconductor layer 620. Then, the oxide semiconductor layer 620 is selectively etched using the resist mask 622, so that an oxide semiconductor layer 624 is formed (see FIG. 15A). Note that after the oxide semiconductor layer 624 is formed, the resist mask 622 is removed. The aforementioned embodiment can be referred to for details of the oxide semiconductor layer. Further, the aforementioned embodiment can be referred to for details of the other components. The thickness of the oxide semiconductor layer 620 can be set as appropriate depending on a desired property. In the case where the oxide semiconductor layer 620 is used for a thin film transistor, for example, the thickness of the oxide semiconductor layer 620 is preferably about 20 nm to 2 μm.

Figure 15A:
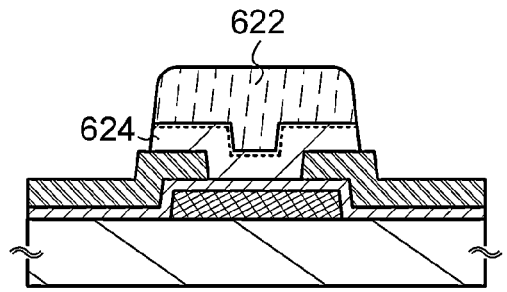
FIGS. 15A to 15E are cross-sectional views illustrating a method for manufacturing a semiconductor device.
Figure 15B:
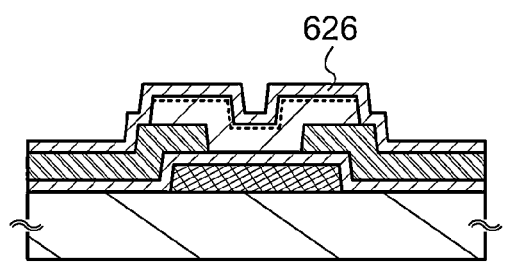
Figure 15C:
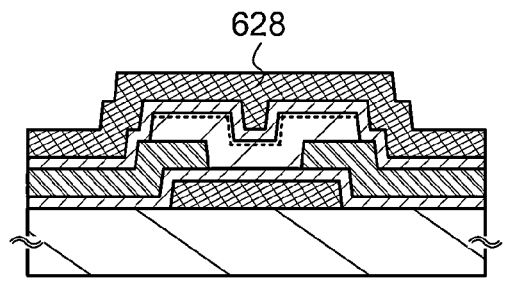
Figure 15D:
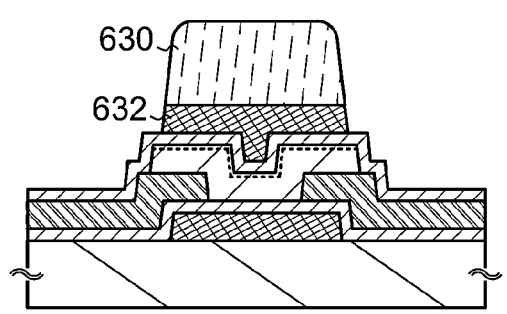

Next, an insulating layer 626 which functions as a gate insulating layer is formed so as to cover the conductive layer 616, the conductive layer 618, and the oxide semiconductor layer 624 (see FIG. 15B). Then, a conductive layer 628 is deposited over the insulating layer 626 (see FIG. 15C), and a resist mask 630 is selectively formed over the conductive layer 628. After that, the conductive layer 628 is selectively etched using the resist mask 630, so that a conductive layer 632 which functions as a gate electrode is formed (see FIG. 15D). After the conductive layer 632 is formed, the resist mask 630 is removed. The aforementioned embodiment can be referred to for details of the above components.

Figure 15E:
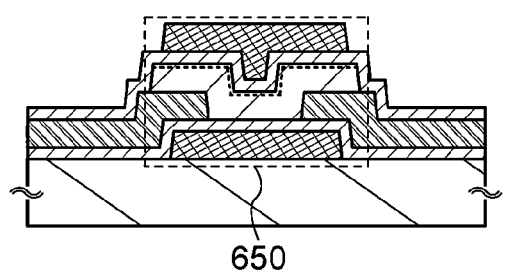
Figures 17A, 17B:
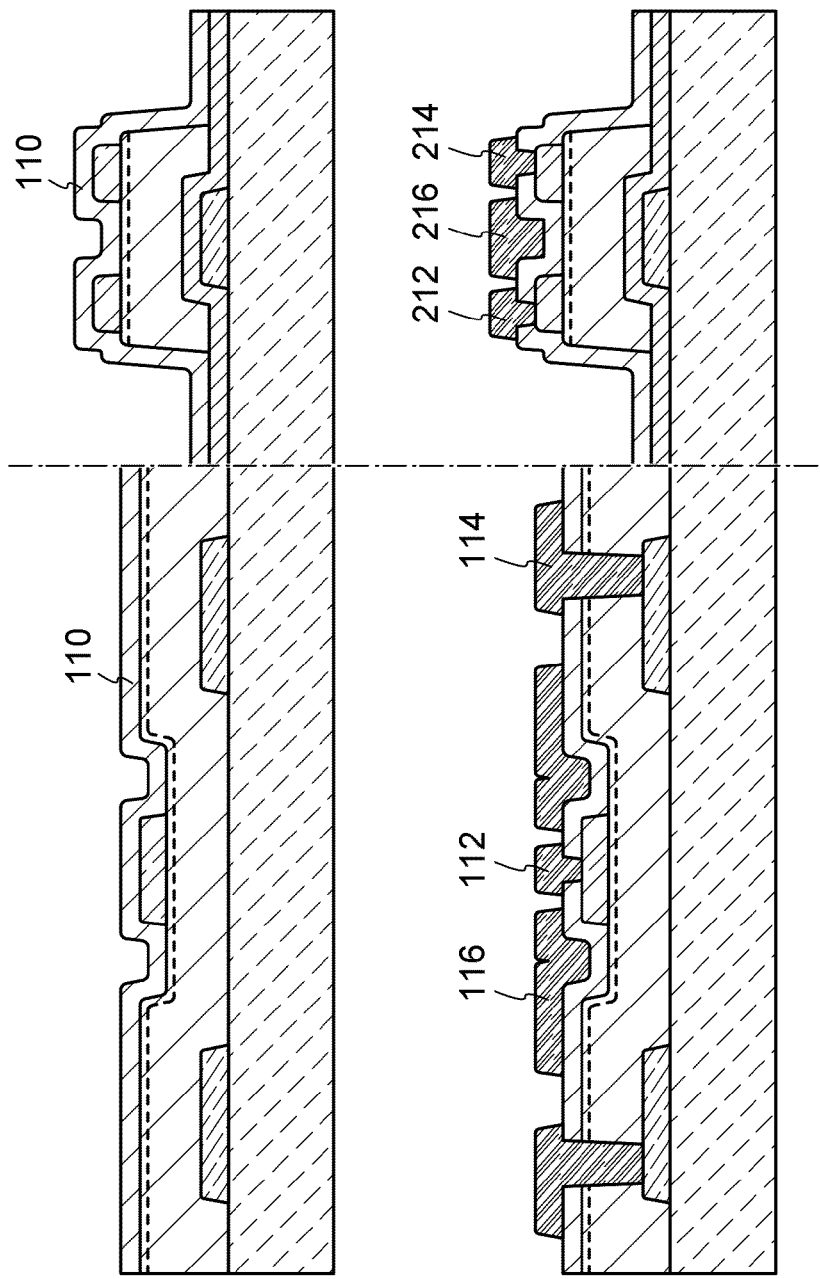
FIGS. 17A and 17B are cross-sectional views illustrating a method for manufacturing a semiconductor device.

In this manner, a transistor 650 which includes the conductive layer 606 formed over the substrate 600, the insulating layer 608 which covers the conductive layer 606, the oxide semiconductor layer 624 formed over the insulating layer 608 that overlaps with part of the conductive layer 606 and has a crystal region in a surface part, the conductive layers 616 and 618 formed in contact with the oxide semiconductor layer 624, the insulating layer 626 which covers the oxide semiconductor layer 624 and the conductive layers 616 and 618, and the conductive layer 632 formed over the insulating layer 626 that overlaps with part of the oxide semiconductor layer 624, is provided (see FIG. 15E). Note that it can be said that the transistor 650 is a novel semiconductor device because an oxide semiconductor layer having a crystal region in a surface part is used and current is controlled with two conductive layers.

When a semiconductor device is manufactured using the oxide semiconductor layer described in the aforementioned embodiment as described in this embodiment, an impurity (e.g., hydrogen (including water)) can be prevented from entering the oxide semiconductor layer. Therefore, the reliability of the semiconductor device can be improved.

In addition, when a semiconductor device is manufactured using the oxide semiconductor layer described in the aforementioned embodiment, it is possible to provide a semiconductor device with favorable electrical characteristics.

Further, by employing a structure where a conductive layer is formed below an oxide semiconductor layer in addition to a conductive layer functioning as a so-called gate electrode, an external electric field can be blocked, so that the adverse effect of the external electric field on the semiconductor device can be reduced. Therefore, generation of parasitic channels due to accumulation of electric charge on the substrate side of the oxide semiconductor layer and fluctuation in the threshold voltage can be prevented.

The structures, methods, and the like described in this embodiment can be combined with any of the structures, methods, and the like described in the other embodiments as appropriate.

Embodiment 9

In this embodiment, an example of a method for manufacturing a so-called power MOSFET and a thin film transistor over the same substrate and in similar steps is described with reference to FIGS. 16A to 16C and FIGS. 17A and 17B. Note that steps of manufacturing a semiconductor device in this embodiment and the steps in the aforementioned embodiment have a lot in common, so that description of common portions is omitted.

Note that the steps of manufacturing the semiconductor device in this embodiment differs from the steps of manufacturing the semiconductor device in the aforementioned embodiment in that a conductive layer for controlling an electric field in an oxide semiconductor layer is formed below the oxide semiconductor layer.

First, the conductive layer 102 is formed over the substrate 100, and a conductive layer 202 which is a component of a thin film transistor is formed. Then, an insulating layer 203 which covers the conductive layer 202 is formed (see FIG. 16A). The aforementioned embodiment (e.g., Embodiment 4) can be referred to for details. Note that the conductive layer 202 is formed in steps similar to those of the conductive layer 102 and has a function of controlling an electric field in an oxide semiconductor layer. It is preferable that the conductive layer 102 be not covered with the insulating layer 203. The insulating layer 203 can be formed in such a manner that an insulating layer is formed over the substrate 100 and is patterned, for example.

Next, the oxide semiconductor layer 104 including the crystal region 106 is formed so as to cover the conductive layer 102, and the oxide semiconductor layer 204 including the crystal region 206 is formed over the insulating layer 203 (see FIG. 16B). Then, the conductive layer 108 is formed in a region over the oxide semiconductor layer 104 that does not overlap with the conductive layer 102, and the conductive layers 208 and 209 are formed over the oxide semiconductor layer 204 (see FIG. 16C). The aforementioned embodiment can be referred to for details.

The following steps are similar to those in the aforementioned embodiment (e.g., Embodiment 4). In other words, the insulating layer 110 is formed so as to cover the oxide semiconductor layer 104, the conductive layer 108, the oxide semiconductor layer 204, the conductive layer 208, and the conductive layer 209 (see FIG. 17A); openings which reach the conductive layers 102, 108, 202, 208, and 209 are formed by selective removal of the insulating layer 110 or the like; then, the conductive layer 112 electrically connected to the conductive layer 108, the conductive layer 114 electrically connected to the conductive layer 102, the conductive layer 116, a conductive layer (not illustrated) electrically connected to the conductive layer 202, the conductive layer 212 electrically connected to the conductive layer 208, the conductive layer 214 electrically connected to the conductive layer 209, the conductive layer 216, and the like are formed (see FIG. 17B). Note that the conductive layer 202 and the conductive layer 216 may be electrically connected to each other; however, in order to control an electric field, the conductive layer 202 and the conductive layer 216 are not necessarily electrically connected to each other. For example, as the potential of the conductive layer 202, any of a floating potential, a fixed potential, and a potential which fluctuates differently from the potential of the conductive layer 216 can be used.

In this manner, the power MOSFET and the thin film transistor can be formed over the same substrate and in similar steps.

Further, by employing a structure where a conductive layer is formed below an oxide semiconductor layer in addition to a conductive layer functioning as a so-called gate electrode, an external electric field can be blocked, so that the adverse effect of the external electric field on the semiconductor device can be reduced. Therefore, generation of parasitic channels due to accumulation of electric charge on the substrate side of the oxide semiconductor layer and fluctuation in the threshold voltage can be prevented.

The structures, methods, and the like described in this embodiment can be combined with any of the other embodiments as appropriate.

Embodiment 10

In this embodiment, a different example of a method for manufacturing a so-called power MOSFET and a thin film transistor over the same substrate and in similar steps is described with reference to FIGS. 18A to 18C and FIGS. 19A and 19B. Note that steps of manufacturing a semiconductor device in this embodiment and the steps in the aforementioned embodiment have a lot in common, so that description of common portions is omitted.

Note that the steps of manufacturing the semiconductor device in this embodiment differs from the steps of manufacturing the semiconductor device in the aforementioned embodiment in that a conductive layer for controlling an electric field is formed below an oxide semiconductor layer of a power MOSFET.

First, the conductive layer 102 and a conductive layer 103 are formed over the substrate 100, and the conductive layer 202 which is a component of a thin film transistor is formed. Then, the insulating layer 203 which covers the conductive layers 103 and 202 is formed (see FIG. 18A). The aforementioned embodiment (e.g., Embodiment 4) can be referred to for details. Note that each of the conductive layers 103 and 202 is formed in steps similar to those of the conductive layer 102 and has a function of controlling an electric field in an oxide semiconductor layer. It is preferable that the conductive layer 102 be not covered with the insulating layer 203. The insulating layer 203 can be formed in such a manner that an insulating layer is formed over the substrate 100 and is patterned, for example.

Next, the oxide semiconductor layer 104 including the crystal region 106 is formed so as to cover the conductive layer 102 and the insulating layer 203, and the oxide semiconductor layer 204 including the crystal region 206 is formed over the insulating layer 203 (see FIG. 18B). Then, the conductive layer 108 is formed in a region over the oxide semiconductor layer 104 that does not overlap with the conductive layer 102, and the conductive layers 208 and 209 are formed over the oxide semiconductor layer 204 (see FIG. 18C). The aforementioned embodiment (e.g., Embodiment 4) can be referred to for details.

The following steps are similar to those in the aforementioned embodiment (e.g., Embodiment 4 or 9). In other words, the insulating layer 110 is formed so as to cover the oxide semiconductor layer 104, the conductive layer 108, the oxide semiconductor layer 204, the conductive layer 208, and the conductive layer 209 (see FIG. 19A); openings which reach the conductive layers 102, 103, 108, 202, 208, and 209 are formed by selective removal of the insulating layer 110 or the like; then, the conductive layer 112 electrically connected to the conductive layer 108, the conductive layer 114 electrically connected to the conductive layer 102, a conductive layer (not illustrated) electrically connected to the conductive layer 103, the conductive layer 116, a conductive layer (not illustrated) electrically connected to the conductive layer 202, the conductive layer 212 electrically connected to the conductive layer 208, the conductive layer 214 electrically connected to the conductive layer 209, the conductive layer 216, and the like are formed (see FIG. 19B). Note that the conductive layers 103 and 116 or the conductive layers 202 and 216 may be electrically connected to each other; however, in order to control an electric field, the conductive layers 103 and 116 or the conductive layers 202 and 216 are not necessarily electrically connected to each other. For example, as a potential of the conductive layer 103 or the potential of the conductive layer 202, any of a floating potential, a fixed potential, and a potential which fluctuates differently from a potential of the conductive layer 116 or the potential of the conductive layer 216 can be used.

In this manner, the power MOSFET and the thin film transistor can be formed over the same substrate and in similar steps.

Further, by employing a structure where a conductive layer is formed below an oxide semiconductor layer in addition to a conductive layer functioning as a so-called gate electrode, an external electric field can be blocked, so that the adverse effect of the external electric field on the semiconductor device can be reduced. Therefore, generation of parasitic channels due to accumulation of electric charge on the substrate side of the oxide semiconductor layer and fluctuation in the threshold voltage can be prevented.

The structures, methods, and the like described in this embodiment can be combined with any of the other embodiments as appropriate.

This application is based on Japanese Patent Application serial no. 2009-235604 filed with Japan Patent Office on Oct. 9, 2009, the entire contents of which are hereby incorporated by reference.

REFERENCE NUMERALS

100: substrate, 102: conductive layer, 103: conductive layer, 104: oxide semiconductor layer, 106: crystal region, 108: conductive layer, 109: conductive layer, 110: insulating layer, 112: conductive layer, 114: conductive layer, 116: conductive layer, 202: conductive layer, 203: insulating layer, 204: oxide semiconductor layer, 206: crystal region, 208: conductive layer, 209: conductive layer, 212: conductive layer, 214: conductive layer, 216: conductive layer, 300: power source, 302: reference voltage generation circuit, 304: reference current generation circuit, 306: error amplifier, 308: PWM buffer, 310: triangle wave generation circuit, 312: coil, 314: power MOSFET, 316: diode, 318: capacitor, 320: resistor, 322: resistor, 350: triangle wave, 352: output waveform, 354: pulse signal, 400: solar cell panel, 402: DC switch, 404: inverter, 406: distribution board, 408: AC switch, 410: electric appliance, 412: transformer, 414: distribution line, 500: substrate, 502: conductive layer, 504: resist mask, 506: conductive layer, 508: insulating layer, 510: oxide semiconductor layer, 512: resist mask, 514: oxide semiconductor layer, 516: conductive layer, 518: resist mask, 520: resist mask, 522: conductive layer, 524: conductive layer, 526: insulating layer, 528: conductive layer, 530: resist mask, 532: conductive layer, 550: transistor, 600: substrate, 602: conductive layer, 604: resist mask, 606: conductive layer, 608: insulating layer, 610: conductive layer, 612: resist mask, 614: resist mask, 616: conductive layer, 618: conductive layer, 620: oxide semiconductor layer, 622: resist mask, 624: oxide semiconductor layer, 626: insulating layer, 628: conductive layer, 630: resist mask, 632: conductive layer, and 650: transistor

The invention claimed is:

1. An integrated circuit comprising a transistor, the transistor comprising:
   a first conductive layer over a substrate;
   a first insulating layer over the first conductive layer;
   an oxide semiconductor layer including a channel formation region over the first insulating layer, wherein the channel formation region and the first conductive layer overlap each other with the first insulating layer therebetween,
   a second conductive layer in contact with the oxide semiconductor layer;
   a third conductive layer in contact with the oxide semiconductor layer;

a second insulating layer over the oxide semiconductor layer, the second conductive layer, and the third conductive layer; and a fourth conductive layer over the second insulating layer, wherein the channel formation region and the fourth conductive layer overlap each other with the second insulating layer therebetween, wherein the fourth conductive layer overlaps the second conductive layer and the third conductive layer, wherein the oxide semiconductor layer comprises a first region and a second region below the first region, wherein the first region comprises a crystal, and a c-axis of the crystal is substantially perpendicular to a surface of the oxide semiconductor layer, wherein the second region has a lower crystallinity than the first region, wherein all the metal elements included in the first region are included in the second region, and all the metal elements included in the second region are included in the first region, and wherein a portion of the second insulating layer is in contact with the first region.

2. The integrated circuit according to claim 1, wherein the second conductive layer and the third conductive layer overlap the first conductive layer.

3. The integrated circuit according to claim 1, wherein the second conductive layer and the third conductive layer are over the oxide semiconductor layer.

4. The integrated circuit according to claim 1, wherein the first region comprises a crystal of $In_2Ga_2ZnO_7$.

5. The integrated circuit according to claim 1, wherein the oxide semiconductor layer contains an In—Ga—Zn—O-based oxide semiconductor material.

6. The integrated circuit according to claim 1, wherein the second conductive layer and the third conductive layer function as a source electrode and a drain electrode, respectively.

7. The integrated circuit according to claim 1, wherein an upper surface of the oxide semiconductor layer is crystallized.

8. The integrated circuit according to claim 1, wherein the second region includes an amorphous structure.

9. The integrated circuit according to claim 1, wherein the crystal has a size of 20 nm or less.

10. The integrated circuit according to claim 1, wherein the fourth conductive layer functions as a gate electrode.

11. The integrated circuit according to claim 1, wherein the first conductive layer is electrically connected to the fourth conductive layer.

12. The integrated circuit according to claim 1, wherein a potential of the first conductive layer is a floating potential.

13. The integrated circuit according to claim 1, wherein a potential of the first conductive layer is a fixed potential.

14. An inverter comprising a transistor, the transistor comprising:
a first conductive layer over a substrate;
a first insulating layer over the first conductive layer;
an oxide semiconductor layer including a channel formation region over the first insulating layer, wherein the channel formation region and the first conductive layer overlap each other with the first insulating layer therebetween, a second conductive layer in contact with the oxide semiconductor layer;

a third conductive layer in contact with the oxide semiconductor layer;

a second insulating layer over the oxide semiconductor layer, the second conductive layer, and the third conductive layer; and a fourth conductive layer over the second insulating layer, wherein the channel formation region and the fourth conductive layer overlap each other with the second insulating layer therebetween, wherein the fourth conductive layer overlaps the second conductive layer and the third conductive layer, wherein the oxide semiconductor layer comprises a first region and a second region below the first region, wherein the first region comprises a crystal, and a c-axis of the crystal is substantially perpendicular to a surface of the oxide semiconductor layer, wherein the second region has a lower crystallinity than the first region, wherein all the metal elements included in the first region are included in the second region, and all the metal elements included in the second region are included in the first region, and wherein a portion of the second insulating layer is in contact with the first region.

15. The inverter according to claim 14, wherein the second conductive layer and the third conductive layer overlap the first conductive layer.

16. The inverter according to claim 14, wherein the second conductive layer and the third conductive layer are over the oxide semiconductor layer.

17. The inverter according to claim 14, wherein the first region comprises a crystal of $In_2Ga_2ZnO_7$.

18. The inverter according to claim 14, wherein the oxide semiconductor layer contains an In—Ga—Zn—O-based oxide semiconductor material.

19. The inverter according to claim 14, wherein the second conductive layer and the third conductive layer function as a source electrode and a drain electrode, respectively.

20. The inverter according to claim 14, wherein an upper surface of the oxide semiconductor layer is crystallized.

21. The inverter according to claim 14, wherein the second region includes an amorphous structure.

22. The inverter according to claim 14, wherein the crystal has a size of 20 nm or less.

23. The inverter according to claim 14, wherein the fourth conductive layer functions as a gate electrode.

24. The inverter according to claim 14, wherein the first conductive layer is electrically connected to the fourth conductive layer.

25. The inverter according to claim 14, wherein a potential of the first conductive layer is a floating potential.

26. The inverter according to claim 14, wherein a potential of the first conductive layer is a fixed potential.

* * * * *